(12) United States Patent
Komano et al.

(10) Patent No.: US 9,255,948 B2
(45) Date of Patent: Feb. 9, 2016

(54) DATA CONVERTING DEVICE, DATA PROCESSING DEVICE, POWER CONSUMPTION PROCESSING SYSTEM AND COMPUTER PROGRAM PRODUCT

(75) Inventors: Yuichi Komano, Kanagawa (JP); Shinji Yamanaka, Tokyo (JP); Toshinari Takahashi, Tokyo (JP); Satoshi Ito, Tokyo (JP); Toru Kambayashi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 848 days.

(21) Appl. No.: 13/372,610

(22) Filed: Feb. 14, 2012

(65) Prior Publication Data

US 2012/0245870 A1    Sep. 27, 2012

(30) Foreign Application Priority Data

Mar. 22, 2011 (JP) .................................. 2011-063230

(51) Int. Cl.
G01R 21/00 (2006.01)
G01R 22/10 (2006.01)
G06Q 30/04 (2012.01)

(52) U.S. Cl.
CPC ................ *G01R 22/10* (2013.01); *G06Q 30/04* (2013.01)

(58) Field of Classification Search
CPC ................................ G01R 22/10; G06Q 50/06
See application file for complete search history.

(56) References Cited

U.S. PATENT DOCUMENTS

| 6,853,291 | B1 * | 2/2005 | Aisa .............................. 340/3.3 |
| 7,463,986 | B2 * | 12/2008 | Hayes ............................ 702/62 |
| 2005/0116836 | A1 * | 6/2005 | Perry et al. ............... 340/870.02 |

FOREIGN PATENT DOCUMENTS

| JP | 2000-134348 | 5/2000 |
| JP | 2002-108945 | 4/2002 |
| JP | 2004-112868 | 4/2004 |
| JP | 2006-162424 | 6/2006 |
| JP | 2006-185697 | 10/2006 |
| JP | 2009-199351 | 9/2009 |
| JP | 2009-211414 | 9/2009 |
| JP | 2010-199296 | 9/2010 |
| JP | 2010-199304 | 9/2010 |
| WO | 2011/064882 A1 | 6/2011 |

OTHER PUBLICATIONS

Japanese Office Action for Japanese Application No. 2011-063230 mailed on Jan. 15, 2013.

* cited by examiner

*Primary Examiner* — Elias Desta
(74) *Attorney, Agent, or Firm* — Amin, Turocy & Watson, LLP

(57) ABSTRACT

According to an embodiment, a data converting device is connected to a power meter configured to add up power consumptions of electrical equipment. The device includes a receiving unit configured to receive power consumptions per predetermined unit time added up by the power meter; and a calculating unit configured to calculate a second sequence to be stored as added up power consumptions in a storage unit from a first sequence containing the power consumptions per unit time received by the receiving unit in time series by using a conversion rule for converting a value of a second element in the second sequence based on a value of a first element in the first sequence. The second sequence has no privacy information and, the second sequence can be used for calculating a total value of the first sequence.

11 Claims, 16 Drawing Sheets

| HOME IDENTIFICATION INFORMATION | MODIFIED DATA SEQUENCE |
|---|---|
| i | $z'_{(i,1)}, \cdots z'_{(i,j)}, \cdots, z'_{(i,m)}$ |
| ⋮ | ⋮ |

DATA CONVERTING DEVICE, DATA PROCESSING DEVICE, POWER CONSUMPTION PROCESSING SYSTEM AND COMPUTER PROGRAM PRODUCT

CROSS-REFERENCE TO RELATED APPLICATION(S)

This application is based upon and claims the benefit of priority from Japanese Patent Application No. 2011-063230, filed on Mar. 22, 2011; the entire contents of which are incorporated herein by reference.

FIELD

Embodiments described herein relate generally to a data converting device, a data processing device, a power consumption processing system and a computer program product.

BACKGROUND

Power supply tends to be diversified in such a manner that renewable energy such as sunlight and wind power is combined with conventional power generation such as nuclear power and thermal power. In order to stabilize power quality when the diversified power supply is used, it has been proposed to build a next-generation power grid (smart grid). In the next-generation power grid, power management needs to be performed by installing a smart meter (hereinafter also referred to as SM) configured to add up power consumptions and a home server configured to manage electrical equipment in every home and office. In addition, a meter data management system (hereinafter also referred to as MDMS) and an energy management system (hereinafter also referred to as EMS) connected to smart meters via the next-generation power grid perform management of power used in homes and offices and control for power supply to homes and offices.

For example, a smart meter communicates with the meter data management system to transmit a power consumption of a home or an office thereto. The meter data management system then stores and manages power consumptions transmitted from smart meters of homes and offices at regular time intervals. The energy management system performs power control including requesting the smart meters or the home servers of homes and offices to reduce power consumptions and charging and discharging of storage batteries connected to the next-generation power grid based on power consumptions of homes and offices stored in the meter data management system.

Moreover, it has been proposed to provide various services by using power consumptions managed by the meter data management system. Provision of such services can be realized by connecting an application server on which various applications are installed to the next-generation power grid. Examples of such application server include a billing server managed by a provider. Such a billing server performs billing processes based on power consumptions of homes and offices managed by the meter data management system.

Power consumptions managed by the meter data management system can be transmitted to the smart meters upon request. For example, upon receipt of a request for accessing power consumptions from a smart meter, the meter data management system can disclose information such as power consumptions managed by the meter data management system.

However, when power consumptions of homes and offices are managed using storage devices included in the meter data management system, an administrator of the meter data management system or an unauthorized third party breaking into the meter data management system can access the power consumptions of homes and offices. If the administrator or the unauthorized third party accesses the power consumptions, he/she can guess whether or not there is someone at home or office, activities of people therein or the like. As a result, privacy concerns arise.

DETAILED DESCRIPTION

According to an embodiment, a data converting device is connected to a power meter configured to add up power consumptions of electrical equipment. The device includes a receiving unit configured to receive power consumptions per predetermined unit time added up by the power meter; and a calculating unit configured to calculate a second sequence to be stored as added up power consumptions in a storage unit from a first sequence containing the power consumptions per unit time received by the receiving unit in time series by using a conversion rule for converting a value of a second element in the second sequence based on a value of a first element in the first sequence. The second sequence has no privacy information, and the second sequence can be used for calculating a total value of elements of the first sequence.

Various embodiments will be described hereinafter with reference to the accompanying drawings.

First Embodiment

Figure 1:
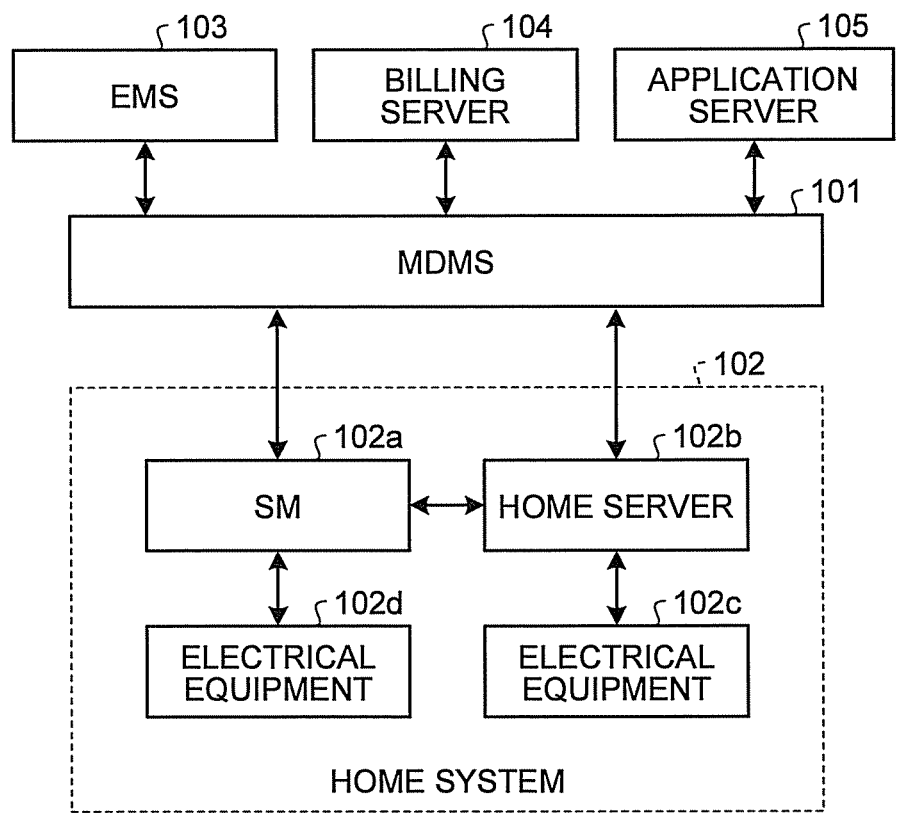
FIG. 1 is a diagram illustrating a configuration of a power consumption calculating system according to a first embodiment.

FIG. 1 is a block diagram illustrating a configuration of a power consumption calculating system according to a first embodiment. In the example of the power consumption calculating system illustrated in FIG. 1, a meter data management system (MDMS) 101, a home system 102, an energy management system (EMS) 103 and a billing server 104 are connected through a network or the like. Although only one home system 102 is illustrated for simplification of the drawing, a plurality of home systems 102 can be connected in the power consumption calculating system. The network may be, for example, a local area network (LAN), an intranet, an Ethernet (registered trademark), the Internet or the like.

The MDMS 101 is a system for collecting and managing power consumptions of homes via the network or the like.

The home system 102 is a system installed in a home and configured to add up power consumptions of electrical equipment used at home. The home system 102 includes a smart meter (SM) 102a, a home server 102b, electrical equipment 102c and electrical equipment 102d. The electrical equipment 102c is connected to the home server 102b through wired or wireless connection. The home server 102b manages power consumptions of electrical equipment 102c thereunder and controls the electrical equipment 102c thereunder. The electrical equipment 102d is connected to the SM 102a through wired or wireless connection. The SM 102a receives a power consumption of the electrical equipment 102c via the home server 102b and adds up power consumptions in the home system 102 together with a power consumption of the electrical equipment 102d. Although an example in which one piece of electrical equipment is connected to each of the smart meter 102a and the home server 102b is illustrated for simplification of the drawing, various electrical equipment are connected to the smart meter 102a and the home server 102b in practice so as to measure power consumptions in each home.

Figure 2:
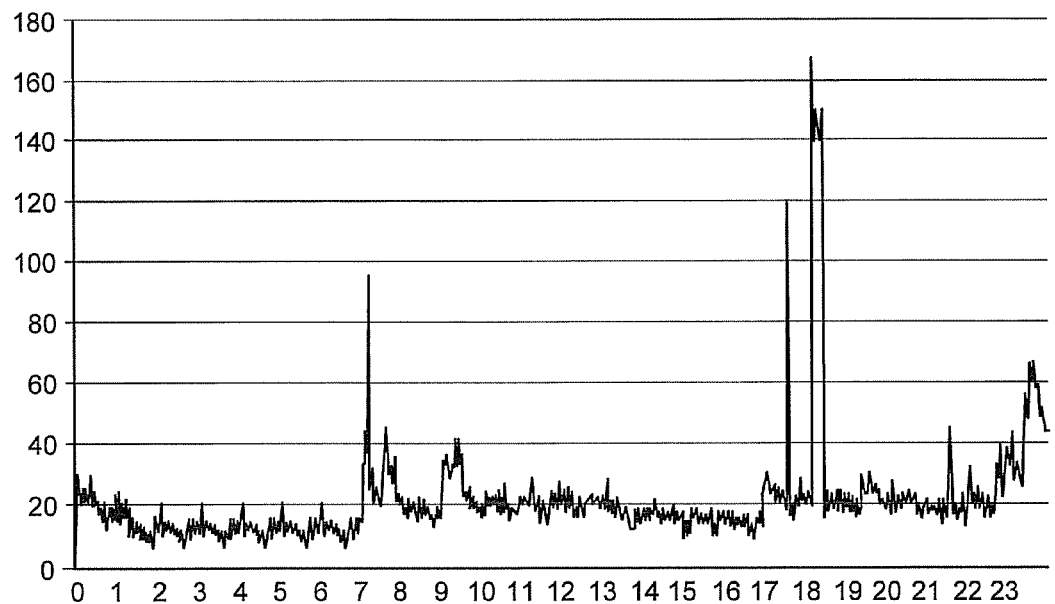
FIG. 2 is a graph illustrating power consumptions added up by the power consumption calculating system according to the first embodiment.

First, an outline of the power consumption calculating system according to this embodiment will be described. In the power consumption calculating system, the MDMS 101 is connected to the SM 102a installed in each home system as illustrated in FIG. 1. The MDMS 101 manages power consumptions per predetermined unit time of each home or office as a sequence. FIG. 2 is a graph illustrating power consumptions of a home or an office in time series. As illustrated in FIG. 2, if the power consumptions are shown in time series, there is a risk that it may be known whether there is someone at home or office or what electrical equipment is in the home or the office.

Figure 3:
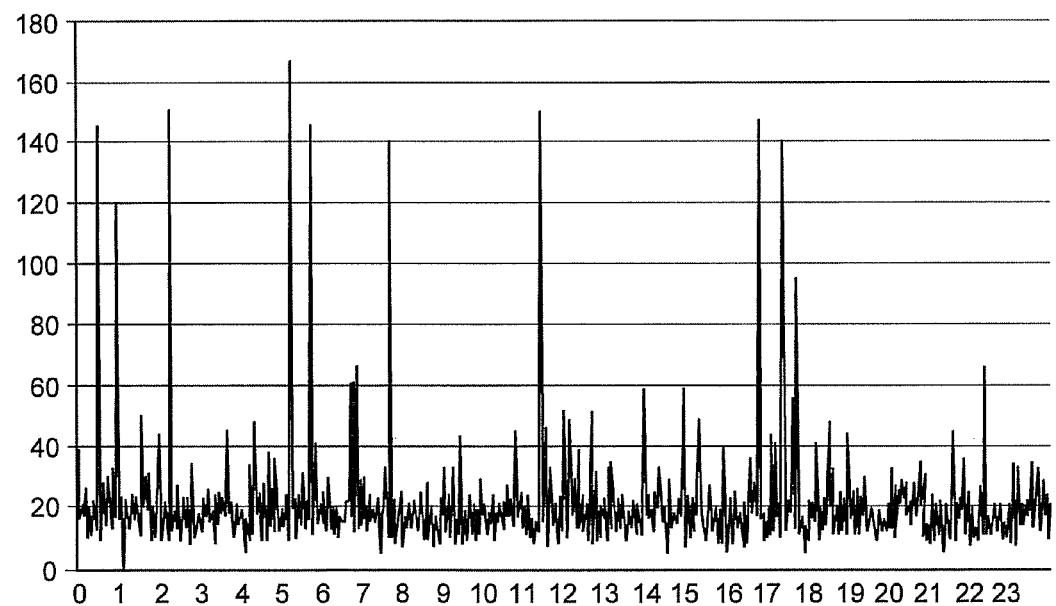
FIG. 3 is a graph illustrating a modified data sequence managed by the power consumption calculating system according to the first embodiment.

Therefore, the meter data management system (MDMS) 101 according to this embodiment calculates a sequence (hereinafter referred to as a modified data sequence) for holding power consumptions of each home or office and protecting the privacy by applying a predetermined conversion rule for converting elements in a sequence (hereinafter referred to as original sequence) to a sequence of power consumptions per unit time of the home or office in time series, and stores the modified data sequence. FIG. 3 is a graph illustrating an example of the modified data sequence calculated from the data sequence illustrated in FIG. 2. As illustrated in FIG. 3, it is difficult to know the power consumptions of each home or office from the modified data sequence generated by using the predetermined conversion rule. Thus, the privacy can be protected. In other words, when power consumptions are managed as the modified data sequence, it is possible to prevent electrical equipment in the home or office or the time during which the electrical equipment is used from being known even if the modified data sequence is illegally accessed. Moreover, it is possible to prevent preference or activities of an individual or an organization from being identified and prevent the individual of the organization itself from being identified based on such information.

However, when the MDMS 101 stores power consumptions per unit time in the form of the modified data sequence, the MDMS 101 needs to transmit a correct total value of the power consumptions of each home or office upon request from another application (such as the billing server 104). Therefore, the conversion rule used by the MDMS 101 in this embodiment is a rule that can derive a total value (hereinafter also referred to as total power consumption) of power consumptions per unit time from the modified data sequence without converting the modified data sequence back to the original sequence of the power consumptions per unit time in time series. The MDMS 101 thus need not convert the modified data sequence back to the original sequence of the power consumptions per unit time in time series when calculating the total power consumption upon request from an application or the like. As a result, it is possible to prevent leakage of privacy information and improve the security.

In this manner, the MDMS 101 outputs total power consumption or the like derived from the modified data sequence upon request from the billing server 104 or the like. Note that the information derived from the modified data sequence by the MDMS 101 without converting the modified data sequence back to the original sequence of the power consumptions per unit time in time series is not limited to the total power consumption, and may be any information requested by an application or the like.

Identification information (referred to as home identification information) is assigned to each home system to identify the home system 102. The home server 102b and the SM 102a store therein the home identification information assigned to the home system 102. The MDMS 101, the EMS 103 and the billing server 104 each store therein the home identification information of all the home systems 102 connected to the power consumption calculating system.

The MDMS 101 receives power consumptions per first unit time of each home system added up by the SM 102a from the SM 102a. The first unit time is a unit time suitable for managing power consumptions of homes and offices by the MDMS 101 and may be a time interval at which the EMS 103 controls the power grid. In this embodiment, the first unit time is 15 minutes, for example.

The MDMS 101 then calculates the modified data sequence from the received data sequence of power consumptions per the first unit time arranged in time series based on the predetermined conversion rule, and stores therein the modified data sequence. Note that the power consumptions received by the MDMS 101 from the SM 102a are associated with the home identification information. The information received by the MDMS 101 from the SM 102a is not limited to information in which the power consumption per the first unit time and the home identification information are associated, and may be association of other information.

The MDMS 101 then calculates information according to the purpose of the application without restoring the original data sequence of the power consumptions per the first unit time arranged in time series from the stored modified data sequence. The calculated information is information on power consumptions of each home or office that is used by the application, such as the total power consumption in an individual home or office.

The MDMS 101 may use a plurality of modified data sequences for calculation based on power consumptions added up by different SMs 102a. The application requesting the MDMS 101 to provide information may be a billing process application implemented in the billing server 104 or various applications implemented in other application servers 105, for example.

As described above, the MDMS 101 transmits the calculated information to the corresponding application server 105. Then, the application server 105 performs processes by a running application by using the received information.

Next, hardware configurations of the MDMS 101, the SM 102a, the home server 102b, the EMS 103 and the billing server 104 will be described. In this embodiment, the billing server 104, the EMS 103 and the MDMS 101 are examples of the server.

The MDMS 101, the EMS 103 and the billing server 104 according to this embodiment each include a control unit such as a central processing unit (CPU) configured to control the entire device and perform basic operation, a main storage unit such as a read only memory (ROM) and a random access memory (RAM) configured to store various data and various programs, a storage unit such as a hard disk drive (HDD) configured to store various data and various programs, an auxiliary storage unit such as a compact disk (CD) drive, and a bus that connects these units, which is a hardware configuration using a common computer system. The MDMS 101 and the EMS 103 each further include a communication interface (I/F) for communication via the network or the like.

The SM 102a and the home server 102b each include a control unit such as a central processing unit (CPU) configured to control the entire device, a main storage unit such as a read only memory (ROM) and a random access memory (RAM) configured to store various data and various programs, an auxiliary storage unit such as a nonvolatile memory configured to store various data and various programs, and a bus that connects these units, which is a configuration similar to that of a dedicated hardware or an embedded system. The SM 102a and the home server 102b each further include a communication interface (I/F) for communication with external devices via the network or the like. In addition, a display unit configured to display various information such as power consumptions and an operation input unit such as an operation button and a keyboard to which a user operation is input are connected to the home server 102b.

Next, various functions implemented by each of the MDMS 101, the SM 102a, the home server 102b, the EMS 103 and the billing server 104 with the hardware configurations described above will be described.

Figure 4:
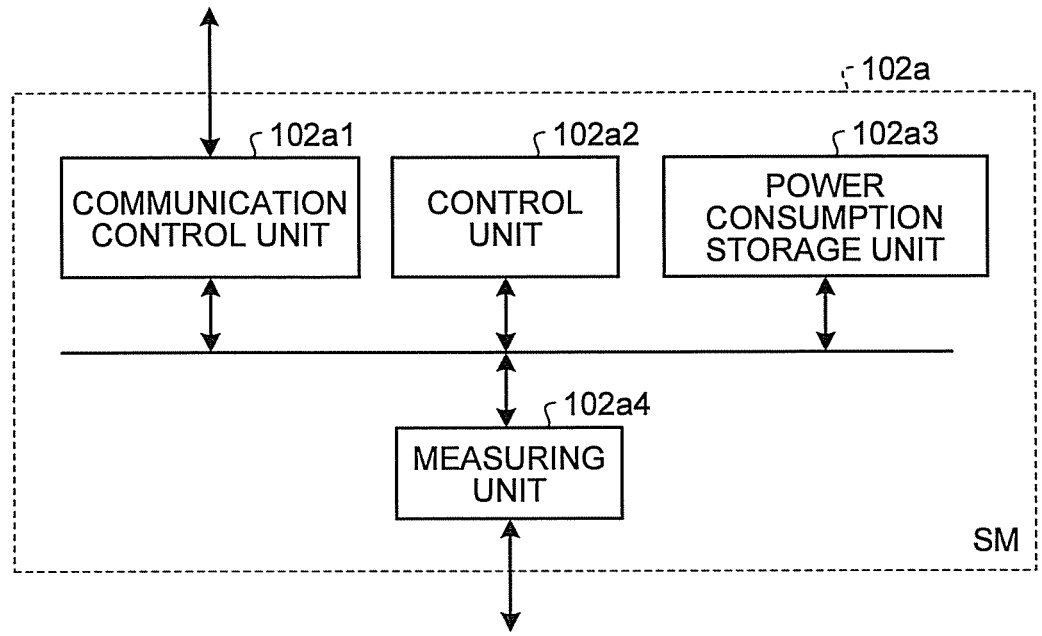
FIG. 4 is a diagram illustrating a functional configuration of a SM according to the first embodiment.

First, various functions implemented by the SM 102a will be described. FIG. 4 is a diagram illustrating a functional configuration of the SM 102a. As illustrated in FIG. 4, the SM 102a includes a communication control unit 102a1, a control unit 102a2, a power consumption storage unit 102a3 and a measuring unit 102a4. These units are implemented by executing various programs stored in the main storage unit and the auxiliary storage unit by the CPU of the SM 102a, by using the communication I/F (not illustrated) of the SM 102a, and in storage areas reserved in the auxiliary storage unit and the like of the SM 102a.

The communication control unit 102a1 controls communication with other devices such as the home server 102b and the MDMS 101.

The control unit 102a2 controls the entire SM 102a.

The measuring unit 102a4 adds up power consumptions $z_{(i,j)}$ of the electrical equipment 102c and 102d per the first unit time. A variable i is an index for identifying the home system 102. A variable j is an index corresponding to an order (date, time, etc.) of the first unit time.

The measuring unit 102a4 also stores the added up power consumptions in the power consumption storage unit 102a3. In this process, the measuring unit 102a4 stores power consumption of the electrical equipment 102d in the power consumption storage unit 102a3 at least once per the first unit time after device authentication of the electrical equipment 102d through the communication control unit 102a1. At the same time, the measuring unit 102a4 stores the power consumption of the electrical equipment 102c managed by the home server 102b, which will be described later, in the power consumption storage unit 102a3. Although the power consumptions of the electrical equipment 102c and 102d are added up per the first unit time as described above in this embodiment, the adding method is not limited thereto.

The power consumption storage unit 102a3 stores therein the power consumptions added up by the measuring unit 102a4.

Figure 5:
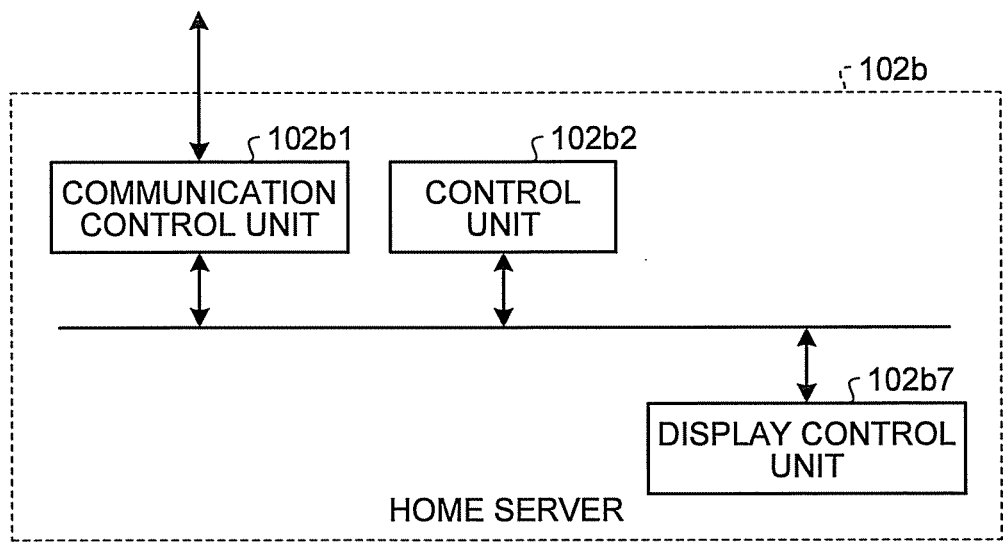
FIG. 5 is a diagram illustrating a functional configuration of a home server according to the first embodiment.

Next, various functions implemented by the home server 102b will be described. FIG. 5 is a diagram illustrating a functional configuration of the home server 102b. As illustrated in FIG. 5, the home server 102b includes a communication control unit 102b1, a control unit 102b2 and a display control unit 102b7. These units are implemented by executing various programs stored in the main storage unit and the auxiliary storage unit by the CPU of the home server 102b, by using the communication I/F (not illustrated) of the home server 102b, and by the display unit (not illustrated) of the home server 102b.

The communication control unit 102b1 controls communication with other devices such as the SM 102a and the MDMS 101. Cryptographic communication with TLS/SSL, SIP (session initiation protocol) or the like may be used for communication with other devices.

The control unit 102b2 controls the entire home server 102b. In addition, for writing a power consumption of the electrical equipment 102c under the home server 102b into the SM 102a, the control unit 102b2 measures the power consumption of the electrical equipment 102c at least once per the first unit time, accesses the SM 102a via the communication control unit 102b1 and stores the measured power consumption in the SM 102a.

The control unit 102b2 also controls a display process associated with a request for accessing power consumptions.

For example, the control unit 102b2 displays power consumptions when an operation requesting to access the power consumptions is received by the operation input unit (not illustrated). In the display process, the control unit 102b2 first generates an access request command for requesting access to the power consumptions. The communication control unit 102b1 then transmits the generated access request command to the MDMS 101. The period (referred to as desired access period) during which the access to the power consumptions is desired may be determined in advance or may be specified by an operation input by the user via the operation input unit. The desired access period and the home identification information are contained in the access request command generated by the control unit 102b2.

The communication control unit 102b1 then receives, from the MDMS 101, power consumptions $z_{(i,j)}$ at one or more first unit times within the desired access period contained in the access request command. The display control unit 102b7 displays the received power consumptions $z_{(i,j)}$ on the display unit according to the control of the control unit 102b2. Although the display unit connected to the home server 102b is used for the display of the power consumptions in the accessing process, an output terminal (not illustrated) connected to an in-home system may alternatively be used.

Figure 6:
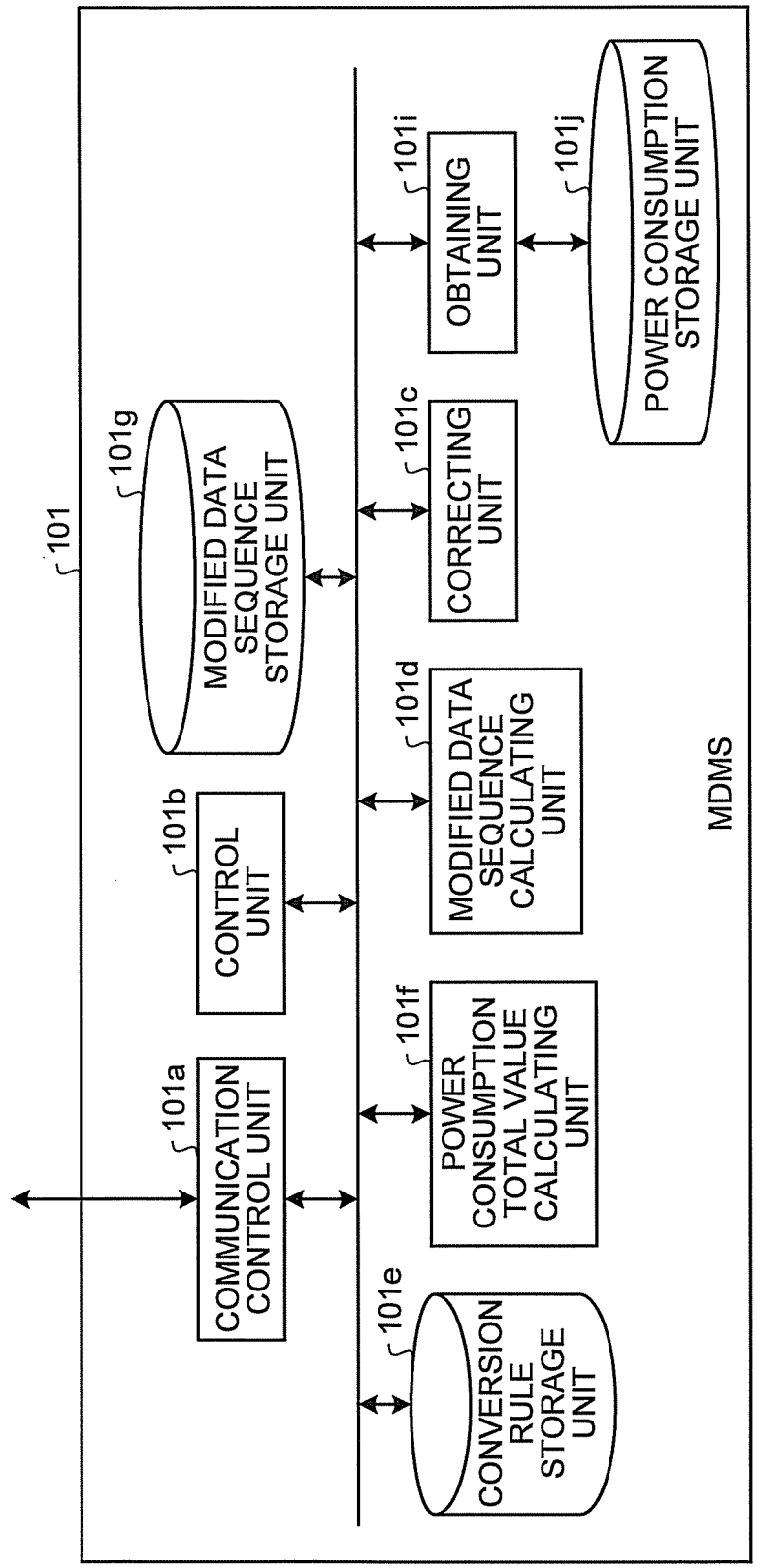
FIG. 6 is a diagram illustrating a functional configuration of a MDMS according to the first embodiment.

Next, various functions implemented by the MDMS 101 will be described. FIG. 6 is a diagram illustrating a functional configuration of the MDMS 101. As illustrated in FIG. 6, the MDMS 101 includes a communication control unit 101a, a control unit 101b, a correcting unit 101c, a modified data sequence calculating unit 101d, a conversion rule storage unit 101e, a power consumption total value calculating unit 101f, a modified data sequence storage unit 101g, an obtaining unit 101i and a power consumption storage unit 101j. These units are implemented by the communication I/F of the MDMS 101, by executing various programs stored in the main storage unit and the auxiliary storage unit by the CPU of the MDMS 101, and storage areas reserved in the storage unit and the like such as the HDD of the MDMS 101.

The control unit 101b controls the entire MDMS 101.

The communication control unit 101a controls communication with other devices such as the SM 102a, the EMS 103, the billing server 104 and the application server 105. Cryptographic communication with TLS/SSL, SIP (session initiation protocol) or the like may be used for communication with other devices. For example, the communication control unit 101a accesses the SM 102a per the first unit time and receives power consumptions $z_{(i,j)}$ stored in the power consumption storage unit 102a3 of the SM 102a from the SM 102a. As another example, the communication control unit 101a receives an access request command from the home server 102b and transmits the power consumptions $z_{(i,j)}$ to the home server 102b in response to the access request command. The communication control unit 101a also transmits total power consumptions per the first unit time of a plurality of homes calculated by the control unit 101b to the EMS 103. The communication control unit 101a also receives a billing process command instructing to perform a billing system process from the billing server 104. The communication control unit 101a transmits to the billing server 104 the total power consumption per second unit time of each home calculated by the power consumption total value calculating unit 101f in response to the billing process command.

The obtaining unit 101i obtains power consumptions per the first unit time used by each home system 102 including various electrical equipment that are received from the SM 102a via the communication control unit 101a.

The power consumption storage unit 101j stores therein a plurality of power consumptions per the first unit time obtained by the obtaining unit 101i from the SM 102a.

The correcting unit 101c checks whether or not there is any error in the power consumptions $z_{(i,j)}$ stored in the power consumption storage unit 101j, calculates a correction amount for the power consumptions $z_{(i,j)}$ as necessary and corrects the power consumptions $z_{(i,j)}$ by using the correction amount. For example, the obtaining unit 101i obtains the power consumptions per the first unit time from the same SM 102a and then stores the received power consumptions in the power consumption storage unit 101j. The correcting unit 101c then checks whether or not there is any error in the power consumptions $z_{(i,j)}$ stored in the power consumption storage unit 101j. If an error is detected, the correcting unit 101c corrects the power consumptions $z_{(i,j)}$ and then stores the corrected power consumptions $z_{(i,j)}$ again in the power consumption storage unit 101j. Note that the corrected power consumptions are also referred to as $z_{(i,j)}$.

After correction by the correcting unit 101c for a plurality of home systems 102, the control unit 101b adds up the power consumptions $z_{(i,j)}$ stored in the power consumption storage unit 101j per the first unit time and calculates total power consumptions $a_{(j)} = \Sigma_i z_{(i,j)}$ of a plurality of homes per the first unit time (j).

The modified data sequence calculating unit 101d calculates a modified data sequence $z'_{(i,j)}$ to be stored in the modified data sequence storage unit 101g as added up power consumptions from a data sequence $z_{(i,j)}$ representing power consumptions per the first unit time stored in the power consumption storage unit 101j by using a predetermined conversion rule (A,b). The predetermined conversion rule (A,b) is a conversion rule for converting a value of a given element included in the power consumptions $z_{(i,j)}$ representing power consumptions per the first unit time in time series for each home identification information based on a value of another element and allows calculation of a total value of the original power consumptions $z_{(i,j)}$ before the calculation according to the conversion rule from the modified data sequence generated by the calculation according to the conversion rule.

Figures 7, 8:
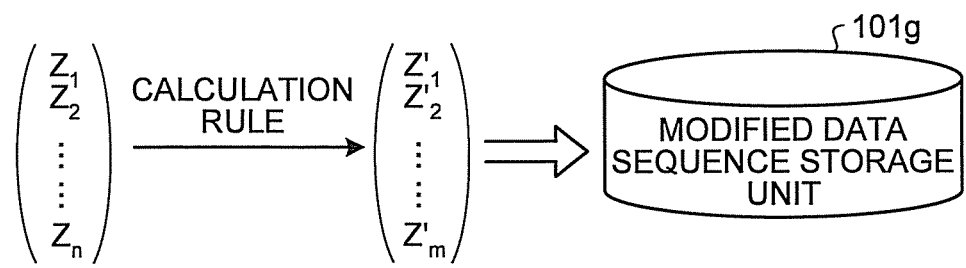
FIG. 7 is a diagram illustrating an operation of a modified data sequence calculating unit according to the first embodiment.
FIG. 8 is a diagram illustrating a table structure in a modified data sequence storage unit according to the first embodiment.

FIG. 7 is an explanatory diagram illustrating the calculation by the modified data sequence calculating unit 101d. As illustrated in FIG. 7, the modified data sequence calculating unit 101d calculates the modified data sequence $z'_{(i,j)}$ from the data sequence $z_{(i,j)}$ by using the predetermined conversion rule (A,b), and stores the calculated modified data sequence $z'_{(i,j)}$ in the modified data sequence storage unit 101g.

The modified data sequence calculating unit 101d may calculate the modified data sequence at a point where all the elements of the data sequence of the power consumptions $z_{(i,j)}$ of each home are obtained, or may calculate the modified data sequence each time some elements of the data sequence of the power consumptions $z_{(i,j)}$ of the homes are obtained (or each time power consumptions $z_{(i,j)}$ are received).

The modified data sequence storage unit 101g stores therein the modified data sequence calculated by the modified data sequence calculating unit 101d. FIG. 8 is a diagram illustrating a table structure in the modified data sequence storage unit 101g. As illustrated in FIG. 8, the modified data sequence storage unit 101g stores therein home identification information in association with the modified data sequence.

A data sequence $(z_{(i,1)}, z_{(i,2)}, \ldots, z_{(i,n)})$ of n power consumptions per the first unit time of each home system 102 (home identification information i) is assumed to be the original data sequence. The modified data sequence calculating unit 101d according to this embodiment calculates the modified data sequence $(z'_{(i,1)}, z'_{(i,2)}, \ldots, z'_{(i,m)})$ from the data sequence ($z_{(i,1)}, z_{(i,2)}, \ldots, z_{(i,n)}$) by using the predetermined conversion rule (A,b) and stores the modified data sequence ($z'_{(i,1)}, z'_{(i,2)}, \ldots, z'_{(i,m)}$) in storage areas (S[i,1], S[i,2], ..., S[i,m]) set in advance for respective elements in the modified data sequence storage unit 101g. In this manner, it is possible to calculate the modified data sequence each time part of the data sequence is obtained by setting storage areas (S[i,1], S[i,2], ..., S[i,m]) for respective elements in advance.

The predetermined conversion rule (A,b) used for calculating the modified data sequence by the modified data sequence calculating unit 101d will be described. The predetermined conversion rule (A,b) according to this embodiment is composed of a matrix A of m rows and n columns and a column vector b of m rows. The modified data sequence calculating unit 101d calculates the modified data sequence by the following equation (1).

$$(z'_{(i,1)}, z'_{(i,2)}, \ldots, z'_{(i,m)})^T = A(z_{(i,1)}, z_{(i,2)}, \ldots, z_{(i,n)})^T + b \qquad (1)$$

This conversion rule (A,b) is described here. The matrix A of the conversion rule (A,b) is set so that a sum of all elements in each column is c[A]. A sum of elements of the column vector b of the conversion rule (A,b) is c[b]. The conversion rule (A,b) is set by the SM 102a or the MDMS 101. A superscript T represents a transpose. For example, ($z'_{(i,1)}, z'_{(i,2)}, \ldots, z'_{(i,m)}$)$^T$ represents a column vector of m rows.

As described above, the modified data sequence may be sequentially calculated or may be calculated after some or all of $z_{(i,j)}$ are obtained. When the modified data sequence is calculated sequentially, the storage areas (S[1], S[2], ..., S[m]) into which ($z'_{(i,1)}, z'_{(i,2)}, \ldots, z'_{(i,m)}$) are to be stored are first initialized to (0, 0, ..., 0). Then, each time the obtaining unit 101i obtains $z_{(i,j)}$, the modified data sequence calculating unit 101d calculates a product of the j-th column A(•:j) of the matrix A and $z_{(i,j)}$ and adds the product to (S[1], S[2], ..., S[m]) as expressed by an equation (2).

$$(S[1], S[2], \ldots, S[m])^T = (S[1], S[2], \ldots, S[m])^T + A(•:j) * z_{(i,j)} \qquad (2)$$

After addition using all of $z_{(i,j)}$ is completed, the modified data sequence calculating unit 101d adds the elements of the column vector b to (S[1], S[2], ..., S[m]).

The conversion rule storage unit 101e stores therein the conversion rule (A,b) used by the modified data sequence calculating unit 101d.

The power consumption total value calculating unit 101f calculates the total value (total power consumption) of power consumed by the home system 102, which is a sum of the elements of the original data sequence per the second unit time, by a predetermined calculation method corresponding to the conversion rule (A,b) from the modified data sequence stored in the modified data sequence storage unit 101g. The power consumption total value calculating unit 101f according to this embodiment calculates a total power consumption per the second unit time in response to a request from the billing server 104. The second unit time is a unit time at which the billing server 104 performs the billing process. The second unit time is one month, for example. Thus, the second unit time is set to include a plurality of first unit times.

Although an example in which power consumptions of each home are hidden is described in this embodiment, what is hidden is not limited to the power consumptions of each home, and may be power consumptions in any range for addition (unit for addition) by a smart meter that handles power.

Note that there is a relation expressed by the following equation (3) between a sum $\Sigma z_{(i,j)}$ (total power consumption) of the elements of the data sequence of each home system 102 (i) calculated by the power consumption total value calculating unit 101f and a sum $\Sigma z'_{(i,j)}$ of the elements of the modified data sequence. c[A] represents a sum of elements in each column of the matrix A and c[b] represents a sum of elements of the column vector b.

$$\sum_{j=1}^{m} Z'_{(i,j)} = C[A] * \sum_{j=1}^{n} Z_{(i,j)} + C[b] \qquad (3)$$

Accordingly, the sum $\Sigma z_{(i,j)}$ (total power consumption) of the elements of the data sequence can be obtained by the following equation (4).

$$\sum_{j=1}^{n} Z_{(i,j)} = \frac{\left(\sum_{j=1}^{m} Z'_{(i,j)} - C[b]\right)}{C[A]} \qquad (4)$$

In this manner, the power consumption total value calculating unit 101f can calculate the total power consumption from the modified data sequence by using c[A] and c[b] in calculating the sum $\Sigma z_{(i,j)}$ (total power consumption) of the elements of the data sequence. In other words, c[A] and c[b] are used in the calculation method corresponding to the conversion rule (A,b) in this embodiment.

When m=n=3, c[A]=1 and c[b]=0 are satisfied, for example, the modified data sequence calculating unit 101d calculates the modified data sequence by using the following matrix A and column vector b.

$$A = \begin{pmatrix} 0 & 1 & 0 \\ 0 & 0 & 1 \\ 1 & 0 & 0 \end{pmatrix}, b = \begin{pmatrix} 3 \\ -5 \\ 2 \end{pmatrix}$$

In this case, the modified data sequence calculating unit 101d calculates a modified data sequence (5, 2, 6) from a data sequence (4, 2, 7), for example. Then, the power consumption total value calculating unit 101f calculates the total power consumption by an equation (5).

$$(\Sigma z'_{(i,j)} - c[b])/c[A] = ((5+2+6)-0)/1 = 13 \qquad (5)$$

It can be confirmed that the value 13 calculated by the equation (5) is equal to $\Sigma z_{(i,j)} = 4+2+7=13$.

When m<n is satisfied, such as when m=2, n=3, c[A]=2 and c[b]=1 are satisfied, for example, the modified data sequence calculating unit 101d calculates the modified data sequence by using the following matrix A and column vector b.

$$A = \begin{pmatrix} 3 & 1 & -3 \\ -1 & 1 & 5 \end{pmatrix}, b = \begin{pmatrix} -1 \\ 2 \end{pmatrix}$$

In this case, the modified data sequence calculating unit 101d calculates a modified data sequence (−8, 35) from a data sequence (4, 2, 7), for example. Then, the power consumption total value calculating unit 101f calculates the total power consumption by an equation (6).

$$(\Sigma z'_{(i,j)} - c[b])/c[A] = ((-8+35)-1)/2 = 13 \qquad (6)$$

It can be confirmed that the value 13 calculated by the equation (6) is equal to $\Sigma z_{(i,j)} = 4+2+7=13$.

Similarly, when m>n is satisfied, such as when m=4, n=3, c[A]=3, c[b]=−1, for example, the modified data sequence calculating unit 101d calculates the modified data sequence by using the following matrix A and column vector b.

$$A = \begin{pmatrix} 2 & -2 & 4 \\ -3 & 1 & 2 \\ -1 & 5 & -1 \\ 5 & -1 & -2 \end{pmatrix}, b = \begin{pmatrix} 3 \\ -1 \\ -4 \\ 1 \end{pmatrix}$$

In this case, the modified data sequence calculating unit 101d calculates a modified data sequence (35, 3, −5, 5) from a data sequence (4, 2, 7), for example. Then, the power consumption total value calculating unit 101f calculates the total power consumption by an equation (7).

$$(\Sigma z'_{(i)} - c[b])/c[A] = ((35 + 3 + (-5) + 5 - (-1))/3 = 13 \quad (7)$$

It can be confirmed that the value 13 calculated by the equation (7) is equal to $\Sigma z_{(i,j)} = 4 + 2 + 7 = 13$.

The MDMS 101 according to this embodiment stores power consumptions of homes in the form of the modified data sequence in the modified data sequence storage unit 101g. It is therefore possible to hide power consumptions of each home per the first unit time.

Next, various functions implemented by the EMS 103 will be described. The EMS 103 performs power control by using a sum of power consumptions of a plurality of homes per the first unit time.

Figure 9:
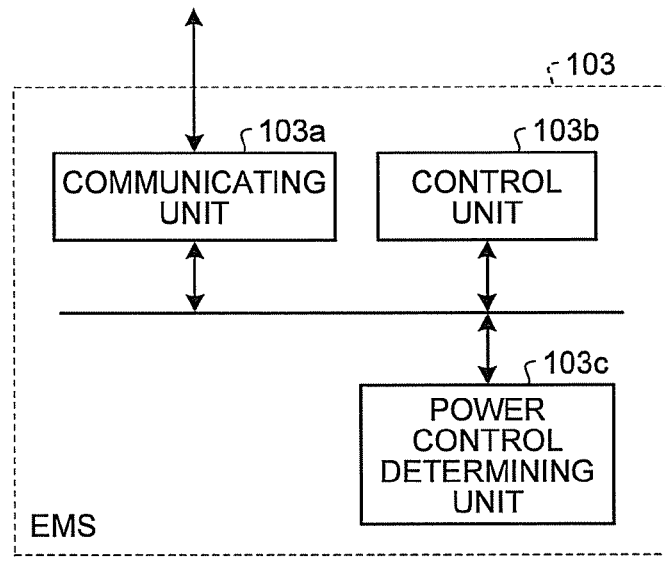
FIG. 9 is a diagram illustrating a functional configuration of an EMS according to the first embodiment.

FIG. 9 is a diagram illustrating a functional configuration of the EMS 103. As illustrated in FIG. 9, the EMS 103 includes a communicating unit 103a, a control unit 103b and a power control determining unit 103c. These units are implemented by the communication I/F of the EMS 103, and by executing various programs stored in the main storage unit and the auxiliary storage unit by the CPU of the EMS 103.

The control unit 103b controls the entire EMS 103.

The communicating unit 103a controls communication with other devices such as the MDMS 101. Cryptographic communication with TLS/SSL, SIP (session initiation protocol) or the like may be used for communication with other devices. The communicating unit 103a receives a total power consumption $a_{(j)}$ per the first unit time (j) from the MDMS 101. The communicating unit 103a also transmits a power control command for controlling electricity use to the SM 102a and the home server 102b under the control of the control unit 103b.

The power control determining unit 103c determines whether or not power control is to be performed based on the total power consumption per the first unit time received by the communicating unit 103a. The power control refers, for example, to suppressing electricity use in each home when the total power consumption exceeds an upper threshold, and charging storage batteries when the total power consumption is lower than a lower threshold. If the power control determining unit 103c determines to perform control to suppress electricity use in each home, the power control determining unit 103c generates a power control command requesting suppression of electricity use. Then, the communicating unit 103a transmits the generated power control command to the SM 102a and the home server 102b.

Figure 10:
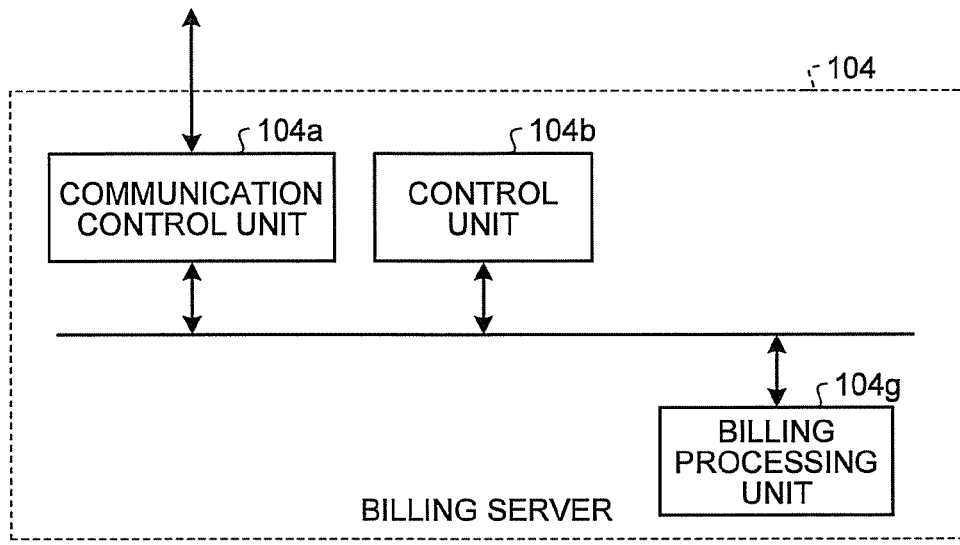
FIG. 10 is a diagram illustrating a functional configuration of a billing server according to the first embodiment.

Next, various functions implemented by the billing server 104 will be described. FIG. 10 is a diagram illustrating a functional configuration of the billing server 104. As illustrated in FIG. 10, the billing server 104 includes a communication control unit 104a, a control unit 104b and a billing processing unit 104g. These units are implemented by the communication I/F of the billing server 104, and by executing various programs stored in the main storage unit and the auxiliary storage unit by the CPU of the billing server 104.

The control unit 104b controls the entire billing server 104.

The communication control unit 104a controls communication with other devices such as the MDMS 101. Cryptographic communication with TLS/SSL, SIP (session initiation protocol) or the like may be used for communication with other devices. The communication control unit 104a transmits a billing process command instructing to perform a billing system process to the MDMS 101 per the second unit time to the MDMS 101 according to control of the control unit 104b. The communication control unit 104a also receives a total power consumption of each home per the second unit time from the MDMS 101.

The billing processing unit 104g performs the billing process based on a second total power consumption of each home system 102 per the second unit time received by the communication control unit 104a.

Figure 11:
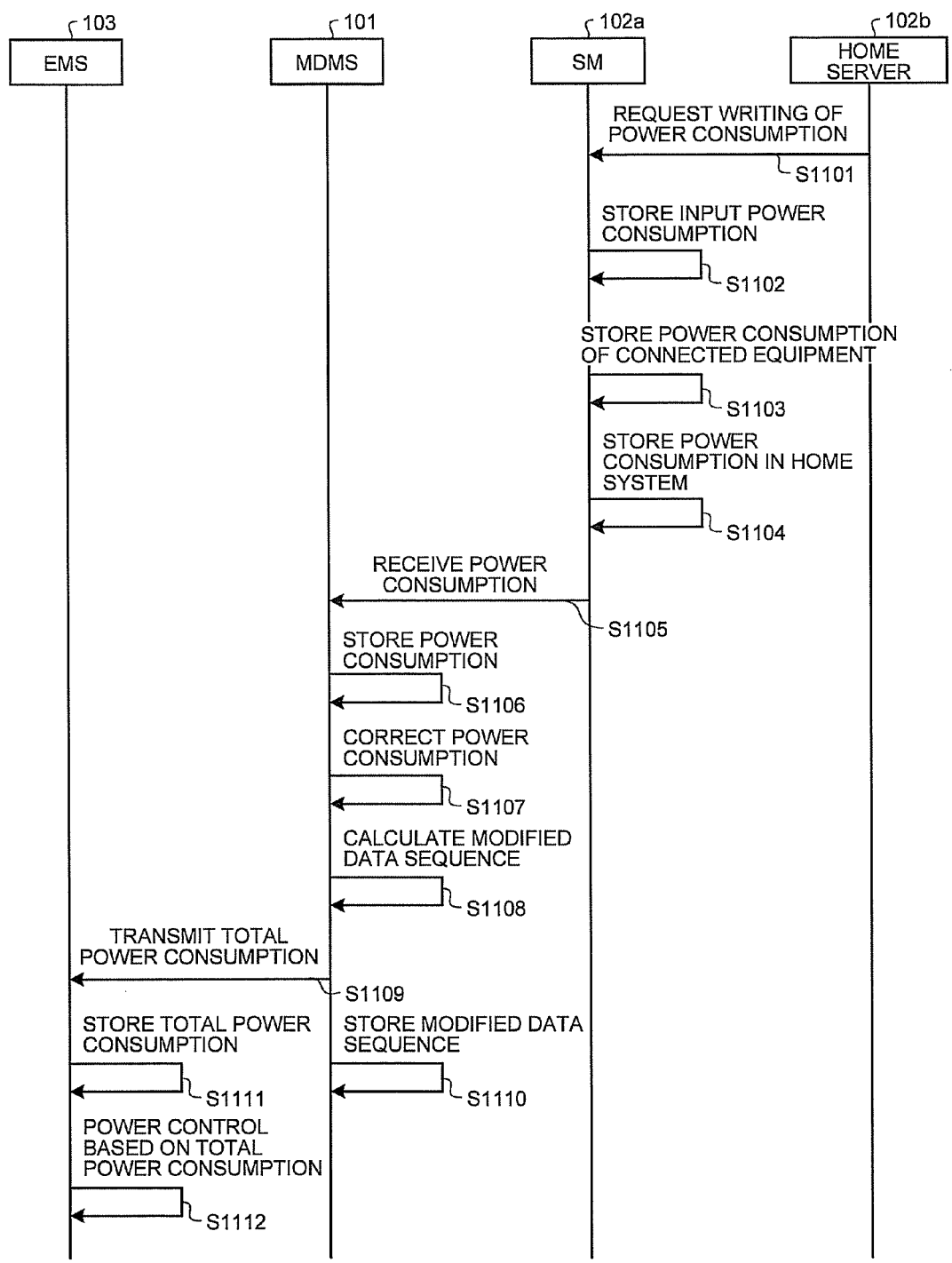
FIG. 11 is a sequence diagram illustrating procedures of a total power consumption calculating process according to the first embodiment.

Next, procedures of processes performed by the power consumption calculating system according to this embodiment will be described. FIG. 11 is a sequence diagram illustrating procedures of a total power consumption calculating process in the power consumption calculating system. In the example illustrated in FIG. 11, the MDMS 101 generates a conversion rule (A,b) in advance and stores the generated conversion rule (A,b) in the conversion rule storage unit 101e. Different conversion rules (A,b) may be used for each home or for each second unit time. When different conversion rules (A,b) are used for each home or for each second unit time, the conversion rule storage unit 101e of the MDMS 101 stores the conversion rules (A,b) in association with the home identification information or information representing the second unit time. The conversion rule (A,b) is not limited to be generated by the MDMS 101. Alternatively, the conversion rule (A,b) may be received from another device and stored in the conversion rule storage unit 101e.

The home server 102b requests the SM 102a to write a power consumption of the electrical equipment 102c connected thereto at least once per the first unit time (step S1101). As a result, the SM 102a stores the input power consumption of the electrical equipment 102c in an auxiliary storage area (not illustrated) (step S1102). The SM 102a also stores a power consumption of the electrical equipment 102d in an auxiliary storage area (not illustrated) at least once per the first unit time according to a request from the electrical equipment 102d (step S1103). The control of steps S1102 and S1103 may be autonomously performed by the SM 102a.

The SM 102a also adds up the written power consumptions of the electrical equipment 102c and 102d per the first unit time and stores the added up power consumptions in the power consumption storage unit 102a3 (step S1104).

The communication control unit 101a of the MDMS 101 accesses the SM 102a at least once per the first unit time and receives the power consumptions $z_{(i,j)}$ stored in the power consumption storage unit 102a3 (step S1105). In this process, the communication control unit 101a also receives the home identification information assigned to the home system 102 from the SM 102a.

The control unit 101b stores the received power consumptions $z_{(i,j)}$ in the power consumption storage unit 101j (step S1106). In this process, the home identification information is also stored in association with the power consumptions $z_{(i,j)}$.

Then, the correcting unit 101c checks whether there is an error in the power consumptions $z_{(i,j)}$ of each home system 102 stored in the power consumption storage unit 101j. If an error is detected, the correcting unit 101c calculates a correction amount and corrects the power consumptions $z_{(i,j)}$ using the correction amount (step S1107). The power consumptions $z_{(i,j)}$ corrected by the correcting unit 101c are stored again in the power consumption storage unit 101j. The MDMS 101 may transmit the corrected value to the SM 102a.

For example, the correcting unit 101c of the MDMS 101 detects and corrects an error of the power consumption $z_{(i,j)}$ by using the power consumptions $z_{(i,j')}$ of a plurality of j's of the same home system 102. Note that the correcting unit 101c may use the power consumption $z_{(i,j')}$ where "j'>j" is satisfied so as to detect and correct an error of the power consumption $z_{(i,j)}$. For example, the correcting unit 101c detects and corrects an error of the power consumption $z_{(i,j)}$ at the first unit time j by the following procedures using power consumption $z_{(i,j-1)}$ at the first unit time "j−1" received from the SM 102a and the power consumption $z_{(i,j+1)}$ at the first unit time "j+1" received from the SM 102a.

The communication control unit 101a of the MDMS 101 receives $z_{(i,j-1)}$, $z_{(i,j)}$ and $z_{(i,j+1)}$ from the SM 102a each time the first unit time elapses. Then, the correcting unit 101c of the MDMS 101 performs error detection by using a predetermined threshold th. For example, the correcting unit 101c determines whether or not the received power consumption $z_{(i,j)}$ is within a range of "$((z_{(i,j-1)}+z_{(i,j+1)})/2)\pm th$". The correcting unit 101c determines that the power consumption $z_{(i,j)}$ is a normal value when the power consumption $z_{(i,j)}$ is within the range, and determines that there is an error when the power consumption $z_{(i,j)}$ is not within the range and corrects the power consumption $z_{(i,j)}$ to "$z_{(i,j-1)}+z_{(i,j+1)}/2$".

When the power consumption $z_{(i,j')}$ where "j'>j" is satisfied is used for error detection and correction of the power consumption $z_{(i,j)}$, the processes of step S1108 and subsequent steps may be performed after the power consumption $z_{(i,j')}$ is read from the SM 102a and error detection and correction of the power consumption $z_{(i,j)}$ are performed by the correcting unit 101c. Some processes such as power control by the EMS 103 that need to be immediate may be performed without performing error detection and correction of the power consumption $z_{(i,j)}$.

The modified data sequence calculating unit 101d of the MDMS 101 calculates the modified data sequence based on the power consumption $z_{(i,j)}$ of the home system 102 and the conversion rule (A,b) stored in the conversion rule storage unit 101e (step S1108). As described above, the timing at which the modified data sequence is calculated is not limited. For example, the modified data sequence may be calculated after receiving part of the data sequence (power consumptions at one or more first unit times). When different conversion rules (A,b) are used for each home or for each second unit time, the modified data sequence calculating unit 101d uses a conversion rule (A,b) associated with home identification information or a second unit time.

The control unit 101b of the MDMS 101 adds up power consumptions $z_{(i,j)}$ of a plurality of home systems 102, calculates total power consumption "$a_{(j)}=\Sigma_i z_{(i,j)}$" of a plurality of homes per the first unit time (j), and transmits the total power consumption $a_{(j)}$ of the homes per the first unit time to the EMS 103 via the communication control unit 101a (step S1109). Note that the processes of steps S1106 to S1109 described above may be performed in any order.

The modified data sequence calculating unit 101d of the MDMS 101 then stores the calculated modified data sequence in the modified data sequence storage unit 101g (step S1110). If the power consumption $z_{(i,j)}$ is not to be used for error detection, correction and calculation (update) of the modified data sequence after storing the modified data sequence, the control unit 101b of the MDMS 101 may erase the power consumption $z_{(i,j)}$ from the RAM (main storage unit) in which the power consumption $z_{(i,j)}$ has been temporarily stored as a work area.

The communicating unit 103a of the EMS 103 receives the total power consumption $a_{(j)}$ of a plurality of homes added up per the first unit time from the MDMS 101 and stores the received total power consumption $a_{(j)}$ in the main storage unit, for example (step S1111). The total power consumption $a_{(j)}$ may be received from the MDMS 101 each time the first unit time elapses or a plurality of total power consumptions corresponding to a plurality of first unit times may be received after the first unit times has elapsed.

The EMS 103 then performs power control based on the total power consumption $a_{(j)}$ per the first unit time (step S1112). After step S1112, the EMS 103 may erase the total power consumptions $a_{(j)}$ per the first unit time from the main storage unit.

Figure 12:
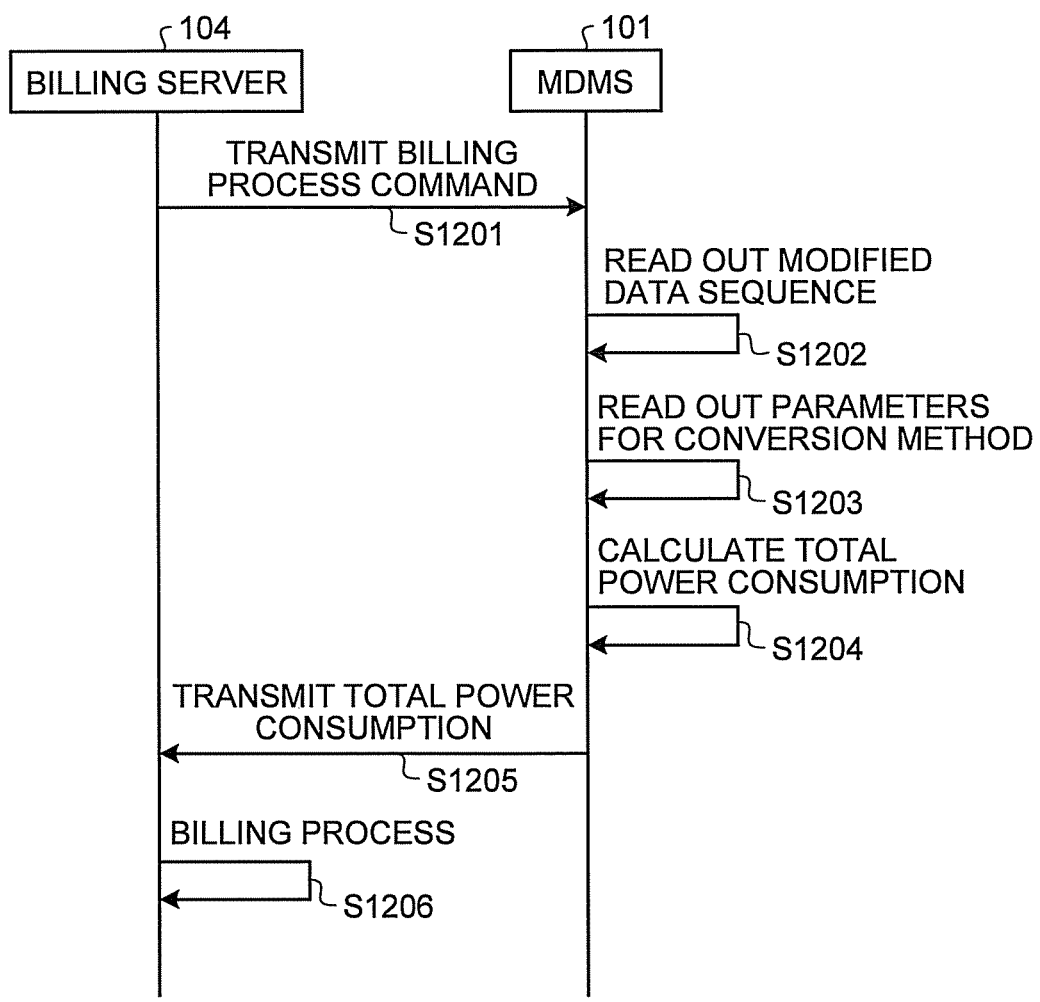
FIG. 12 is a sequence diagram illustrating procedures of a billing system process according to the first embodiment.

Next, procedures of the billing system process performed by the power consumption calculating system will be described. When the total power consumption calculating process illustrated in FIG. 11 is performed, the modified data sequence containing the power consumptions per the first unit time is stored in the modified data sequence storage unit 101g. Then, each time the second unit time elapses, the billing server 104 receives the total power consumption of each home in the second unit time from the MDMS 101 and performs the billing process. FIG. 12 is a sequence diagram illustrating procedures of the billing system process including the billing process in the power consumption calculating system.

First, the billing server 104 transmits a billing process command instructing to perform the billing system process to the MDMS 101 per the second unit time (step S1201). The billing process command specifies the second unit time and the home identification information for the billing process. The billing process command may be transmitted by the MDMS 101 to the billing server 104 instead of being transmitted by the billing server 104.

When the communication control unit 101a of the MDMS 101 receives the billing process command, the power consumption total value calculating unit 101f reads out the modified data sequence $(z'_{(i,1)}, z'_{(i,2)}, \ldots, z'_{(i,m)})$ of the power consumptions associated with the specified home identification information and second unit time from the modified data sequence storage unit 101g (step S1202). Then, the power consumption total value calculating unit 101f reads out a sum c[A] and a sum c[b] of the elements of b that are parameters of a conversion method corresponding to the conversion rule (A,b) (step S1203).

The power consumption total value calculating unit 101f of the MDMS 101 calculates (restore) the total power consumption in the second unit time by the following equation (8) using the sum c[A], the sum c[b] and the modified data sequence (step S1204).

$$\Sigma_j z_{(i,j)} = (\Sigma_{j'} z'_{(i,j')} - c[b])/c[A] \quad (8)$$

The index i corresponds to the home identification information. The index j corresponds to each element in the data sequence at the second unit time and is a value from 1 to n. The index j' corresponds to each element in the modified data sequence at the second unit time and is a value from 1 to m.

The communication control unit 101a of the MDMS 101 transmits the calculated total power consumption $\Sigma_j z_{(i,j)}$ at the second unit time to the billing server 104 (step S1205). Note that the MDMS 101 may erase the modified data sequence $(z'_{(i,1)}, z'_{(i,2)}, \ldots, z'_{(i,m)})$ from the modified data sequence storage unit 101g predetermined time after transmission of the total power consumption $\Sigma_j z_{(i,j)}$ to the billing server 104. The predetermined time is a period during which there is a possibility that second total power consumption be transmitted again and received from the billing server 104. The predetermined time may be three months, for example.

The billing server 104 performs the billing process for the power consumed in the second unit time for each home based on the received total power consumption (step S1206).

As described above, in the MDMS 101 of this embodiment, the power consumptions per the first unit time of each home are converted into the modified data sequence by using the conversion rule (A,b), and then stored in the modified data sequence storage unit 101g. The modified data sequence storage unit 101g cannot restore the power consumptions per the first unit time of each home only by referring to the modified data sequence stored in the modified data sequence storage unit 101g. Accordingly, even if the modified data sequence is leaked because of erroneous processing of the administrator of the MDMS 101, an erroneous setting of access control, an unauthorized invasion or the like, the power consumptions per the first unit time of each home can be prevented from being leaked. Therefore, a third party cannot guess whether or not there is someone at home or activities at certain time, and the privacy of each home can thus be protected.

The EMS 103 according to this embodiment performs, as an application server, power control by using the total power consumption in the first unit time of a plurality of homes. Accordingly, in this embodiment, the MDMS 101 calculates the total power consumption in the first unit time of a plurality of homes from the power consumptions in the first unit time of each home, and transmits the calculation result to the EMS 103. As a result, the EMS 103 can know the total power consumption of a plurality of homes in the first unit time but cannot know the power consumptions in the first unit time of each home. Thus, the privacy of each home can be protected.

In this embodiment, an example in which the billing server 104 performing the billing process using the total power consumption in the second unit time of each home is used as an application server is described. In this embodiment, the MDMS 101 calculates the total power consumption per the second unit time of each home from the power consumptions per the first unit time of each home, and transmits the calculation result to the billing server 104. As a result, the billing server 104 can know the total power consumption per the second unit time of each home but cannot know the power consumptions per the first unit time of each home. Thus, the privacy of each home can be protected.

Modified Example 1 of First Embodiment

In the first embodiment, the matrix A used in the conversion rule may be any matrix as long as the sum of the elements in each column is c[A]. In contrast, an example in which a matrix A used as a conversion rule is a nonsingular matrix in addition to the condition that the sum of the elements in each column is c[A] will be described in the modified example 1 of the first embodiment.

Figure 13:
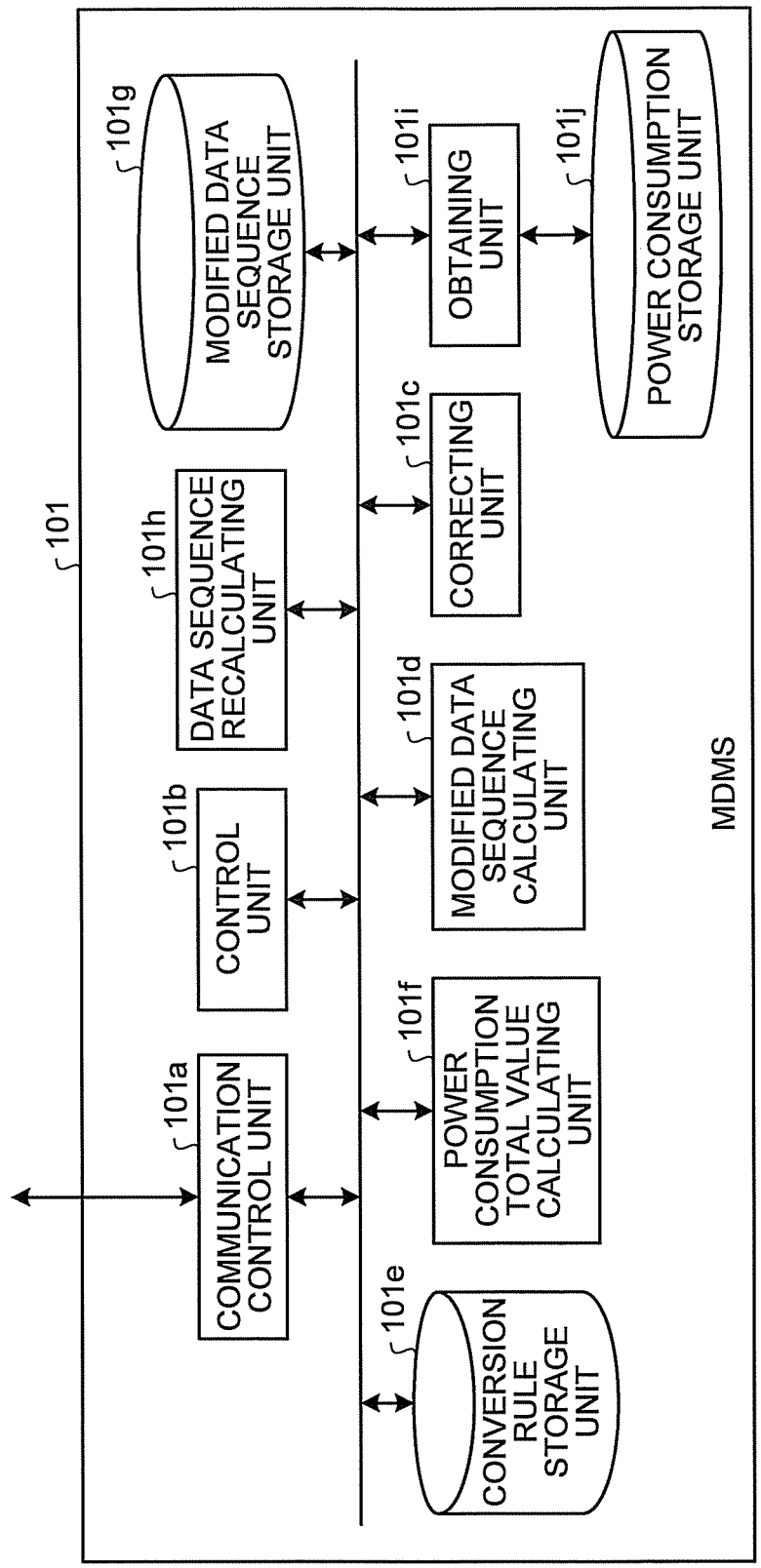
FIG. 13 is a diagram illustrating a functional configuration of a MDMS according to a modified example 1 of the first embodiment.

FIG. 13 is a diagram illustrating a functional configuration of an MDMS 101 according to the modified example 1 of the first embodiment. The MDMS 101 according to the modified example 1 of the first embodiment illustrated in FIG. 13 additionally includes a data sequence recalculating unit 101h as compared to the MDMS 101 of the first embodiment. Since the other systems and functional configurations of the power consumption calculating system according to this modified example are similar to those in the first embodiment, description thereof will not be repeated.

The data sequence recalculating unit 101h calculates an original data sequence by applying an inverse matrix of the nonsingular matrix A included in the conversion rule (A,b) stored in the conversion rule storage unit 101e to the modified data sequence. As described above, an inverse matrix can be obtained because the matrix A included in the conversion rule (A,b) is a nonsingular matrix in this modified example. In other words, the original data sequence can be calculated from the modified data sequence by using the inverse matrix.

As described above, the MDMS 101 according to the modified example 1 of the first embodiment can transmit the original data sequence representing the power consumptions per the first unit time of a home in response to a power consumption accessing request from the home.

The conversion rule (A,b) stored in the conversion rule storage unit 101e is stored in an area that cannot be externally referred to. Alternatively, the conversion rule storage unit 101e stores therein an encrypted conversion rule (A,b). Therefore, an unauthorized third party is prevented from accessing the conversion rule (A,b) and calculating the original data sequence.

Since procedures of the total power consumption calculating process and the billing process are similar to those described in the first embodiment, the description thereof will not be repeated. It has been described that in the billing system process illustrated in FIG. 12 of the first embodiment, the MDMS 101 may erase the modified data sequence from the modified data sequence storage unit 101g after a predetermined time (a period during which there is a possibility that total power consumption be transmitted again and received from the billing server 104). In this modified example, in contrast, the modified data sequence is stored only during a period where there is a possibility that total power consumption be retransmitted and received from the billing server 104 or a period where there is a possibility that an access requesting process be received from the home system 102 so as to respond to an access requesting process from the SM 102a. The storage period is, for example, 10 years.

Figure 14:
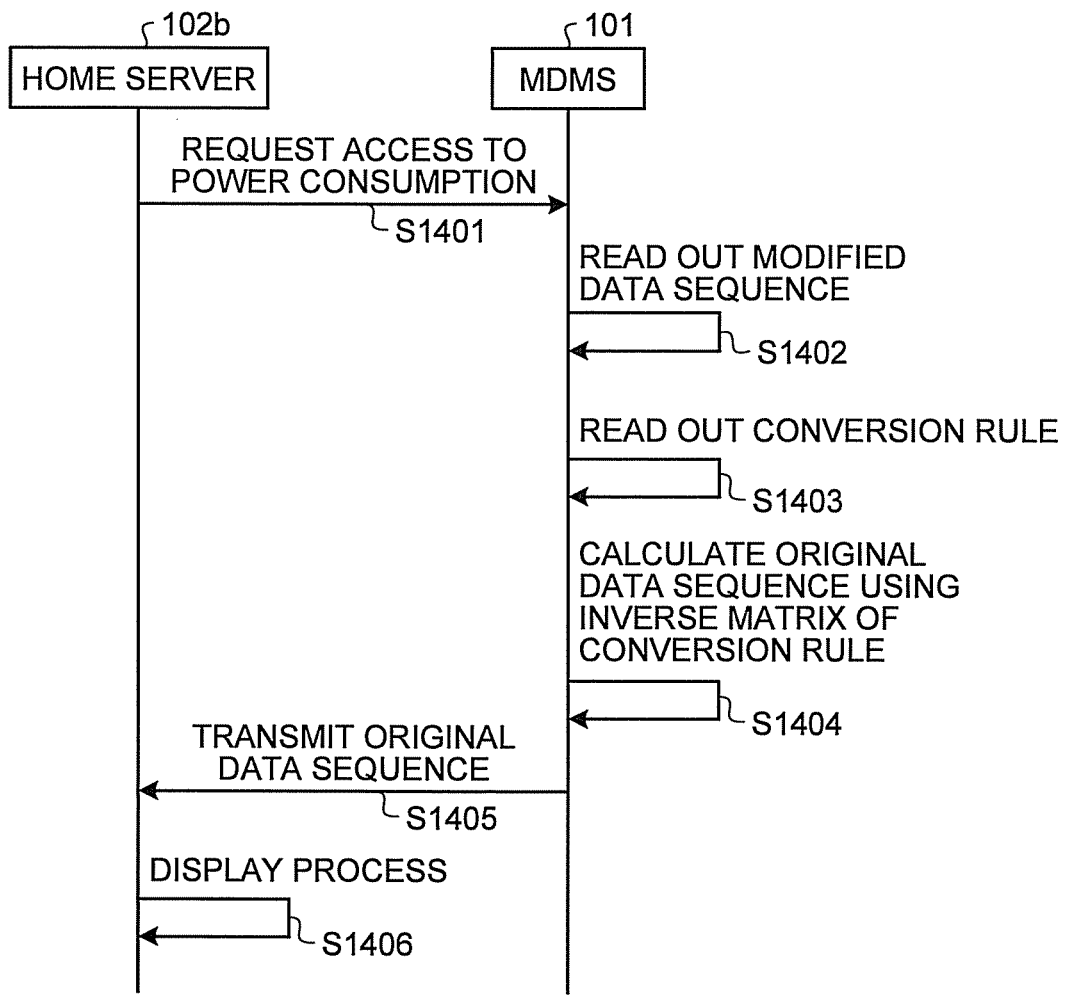
FIG. 14 is a sequence diagram illustrating procedures of an access requesting process according to the modified example 1 of the first embodiment.

Next, procedures of the access requesting process performed by the power consumption calculating system according to this modified example will be described. It is assumed that the total power consumption calculating process is performed before the access requesting process, and that the modified data sequence $(z'_{(i,1)}, z'_{(i,2)}, \ldots, z'_{(i,n)})$ of power consumptions per the first unit time of each home is stored in association with the home identification information in the modified data sequence storage unit 101g. FIG. 14 is a sequence diagram illustrating procedures of the access requesting process in the power consumption calculating system.

The home server 102b of the home system 102 transmits an access request command Req_i requesting access to power consumptions to the MDMS 101 (step S1401).

When the communication control unit 101a of the MDMS 101 receives the access request command Req_i, the data sequence recalculating unit 101h reads out the modified data sequence $(z'_{(i,1)}, z'_{(i,2)}, \ldots, z'_{(i,n)})$ stored in association with the home identification information and the access request period specified by the access request command Req_i (step S1402). The data sequence recalculating unit 101h also reads out the conversion rule (A,b) from the conversion rule storage unit 101e (step S1403). When the access request period is over a plurality of second unit times, the data sequence recalculating unit 101h reads out a plurality of modified data sequences associated thereto, respectively, and the conversion rule.

The data sequence recalculating unit 101h of the MDMS 101 calculates the original data sequence (z(i,1), z(i,2), ..., z(i,n)) representing power consumptions in time series from the modified data sequence by using an inverse matrix or the like of a nonsingular matrix A included in the conversion rule (A,b) (step S1404). An equation (9) used for the calculation is as follows.

$$(z_{(i,1)}, z_{(i,2)}, \ldots, z_{(i,n)}) = A^{-1}(z'_{(i,1)}, z'_{(i,2)}, \ldots, z'_{(i,n)}) - b) \tag{9}$$

In the equation, $A^{-1}$ is an inverse matrix of A. $A^{-1}$ may be calculated in advance when A is generated and stored in the conversion rule storage unit 101e together with A, or may be calculated from the nonsingular matrix A in response to the access request.

The communication control unit 101a of the MDMS 101 then transmits $z_{(i,k)}, z_{(i,k+1)}, \ldots, z_{(i,l)}$ associated with the access request period out of the calculated original data sequences to the home server 102b (step S1405). It is assumed here that $1 \leq k < l \leq n$ is satisfied.

The home server 102b displays $z_{(i,k)}, z_{(i,k+1)}, \ldots, z_{(i,l)}$ received from the MDMS 101 on the display unit (step S1406). The access requesting process is terminated here.

Since the conversion rule is stored in a manner that the conversion rule cannot be referred to in the modified example of the first embodiment, the power consumptions per the first unit time of each home cannot be calculated only by referring to the modified data sequence similarly to the first embodiment. Thus, the privacy of each home can be protected. In addition, the privacy of each home can also be protected in the EMS 103 and the billing server 104 in the modified example similarly to the first embodiment.

Modified Example 2 of First Embodiment

Examples in which a (transformation) matrix is used as the conversion rule have been described in the embodiment and the modified example described above. However, the conversion rule is not limited to using a matrix.

Therefore, an example in which conversion using a matrix is not made will be described in the modified example 2 of the first embodiment. The modified data sequence calculating unit 101d of this modified example generates a modified data sequence $z'_{(i,1)}, z'_{(i,2)}, \ldots, z'_{(i,n)}$ by rearranging the order of the data sequence $z_{(i,1)}, z_{(i,2)}, \ldots, z_{(i,n)}$ by a predetermined rule. The power consumption total value calculating unit 101f can calculate a total value of the data sequence by summing the elements of the thus generated modified data sequence $z'_{(i,1)}, z'_{(i,2)}, \ldots, z'_{(i,n)}$.

Since a third party cannot recognize the power consumptions of each home according to time series also from the modified data sequence generated by shuffling the elements of the data sequence in this manner, the privacy can be protected. Moreover, since the operation for generating the modified data sequence and the calculation of total power consumption are facilitated, the processing load on the MDMS 101 can be reduced. The shuffling of the elements of the data sequence can also be regarded as an operation using a nonsingular matrix in which each row and each column of the matrix A of the conversion rule (A,b) have one "1" therein.

Second Embodiment

An example in which the MDMS is one server has been described in the first embodiment. However, the MDMS is not limited to one server. Therefore, an example in which a plurality of servers are applied as the MDMS of the power consumption calculating system will be described in the second embodiment. Parts that are the same as those in the first embodiment described above will be designated by the same reference numerals and the description thereof will not be repeated.

Accordingly, an example in which a power consumption calculating system according to the second embodiment performs the calculation of the modified data sequence and the storage of the modified data sequence using different servers will be described.

Figure 15:
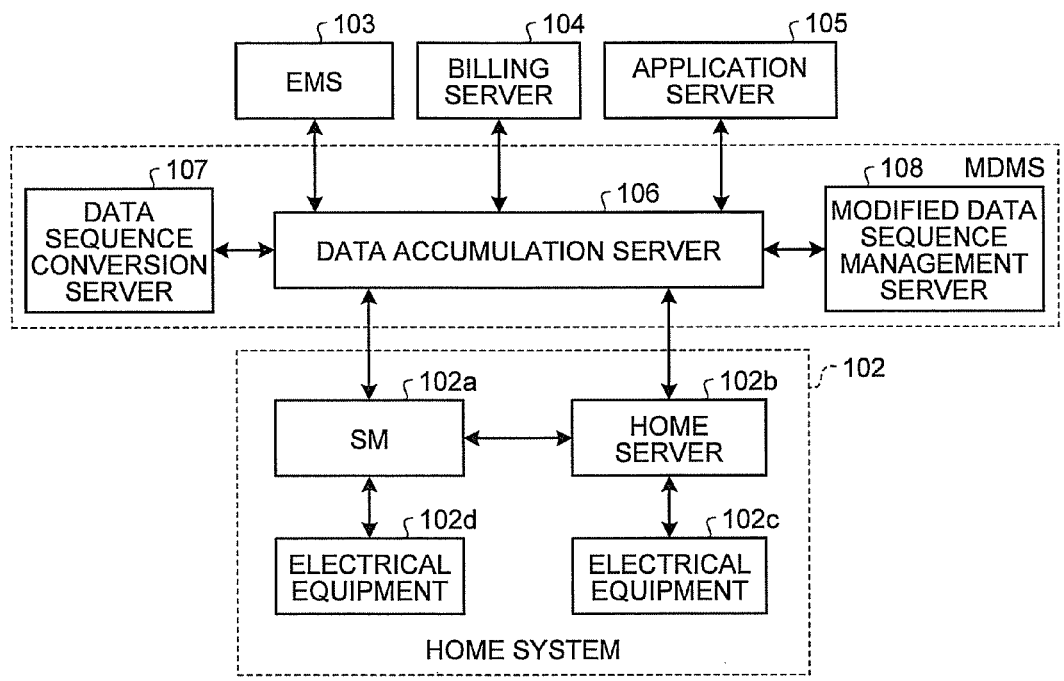
FIG. 15 is a diagram illustrating a configuration of a power consumption calculating system according to a second embodiment.

FIG. 15 is a diagram illustrating a configuration of the power consumption calculating system according to the second embodiment. As illustrated in FIG. 15, the power consumption calculating system includes a meter data management system (MDMS) including a data accumulation server 106, a data sequence conversion server 107 and a modified data sequence management server 108, a home system 102, an energy management system (EMS) 103 and a billing server 104, which are connected via network or the like. Although only one home system 102 is illustrated for simplification of the drawing, a plurality of home systems 102 can be connected in the power consumption calculating system.

The data accumulation server 106 collects power consumptions of each home via the network or the like, calculates total power consumption (total value of the power consumptions) as necessary and transmits the total power consumption to another server or the like. For example, the data accumulation server 106 calculates a total power consumption per the first unit time of a plurality of homes based on power consumptions of the homes and transmits the calculated total power consumption to the EMS 103. As another example, the data accumulation server 106 calculates a total power consumption per the second unit time of each home from the modified data sequence and transmits the calculated total power consumption to the billing server 104. Since the data accumulation server 106 can calculate the total power consumption per the second unit time of each home from the modified data sequence without restoring the original data sequence of the power consumptions per the first unit time, privacy information can be prevented from being leaked.

The data sequence conversion server 107 calculates the modified data sequence based on the power consumptions per the first unit time of each home and the conversion rule (A,b) described above. It is assumed here that the same calculation method as that described in the first embodiment is used, and the description thereof will not be repeated.

The modified data sequence management server 108 stores and manages the modified data sequence calculated by the data sequence conversion server 107.

Next, hardware configurations of the data accumulation server 106, the data sequence conversion server 107 and the modified data sequence management server 108 will be described. The data accumulation server 106, the data sequence conversion server 107 and the modified data sequence management server 108 each include a control unit such as a central processing unit (CPU) configured to control the entire device and perform basic operation, a main storage unit such as a read only memory (ROM) and a random access memory (RAM) configured to store various data and various programs, a storage unit such as a hard disk drive (HDD) configured to store various data and various programs, an auxiliary storage unit such as a compact disk (CD) drive, a communication interface (I/F) for communication via the network or the like, and a bus that connects these units, which is a hardware configuration using a common computer system.

Next, various functions implemented by each of the data accumulation server 106, the data sequence conversion server 107 and the modified data sequence management server 108 with the hardware configurations described above will be described.

Figure 16:
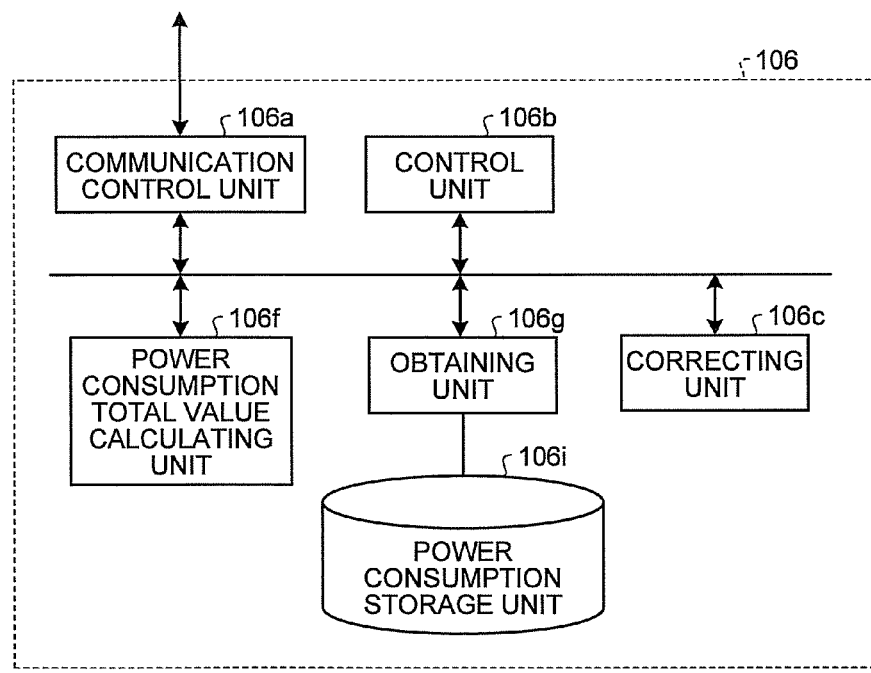
FIG. 16 is a diagram illustrating a functional configuration of a data accumulation server according to the second embodiment.

First, various functions implemented by the data accumulation server 106 will be described. FIG. 16 is a diagram illustrating a functional configuration of the data accumulation server 106. As illustrated in FIG. 16, the data accumulation server 106 includes a communication control unit 106a, a control unit 106b, a correcting unit 106c, a power consumption total value calculating unit 106f, an obtaining unit 106g, and a power consumption storage unit 106i. These units are implemented by executing various programs stored in the main storage unit and the auxiliary storage unit by the CPU of the data accumulation server 106, by using the communication I/F (not illustrated) of the data accumulation server 106, and in storage areas reserved in the storage unit and the like such as the HDD of the data accumulation server 106.

The control unit 106b controls the entire data accumulation server 106.

The communication control unit 106a controls communication with other devices such as the SM 102a, the EMS 103, the billing server 104 and the application server 105. Cryptographic communication with TLS/SSL, SIP (session initiation protocol) or the like may be used for communication with other devices. For example, the communication control unit 106a accesses the SM 102a per the first unit time and receives power consumptions $z_{(i,j)}$ stored in the power consumption storage unit 102a3 of the SM 102a from the SM 102a. As another example, the communication control unit 106a receives an access request command from the home server 102b and transmits the power consumptions $z_{(i,j)}$ to the home server 102b in response to the access request command. The communication control unit 106a also transmits total power consumptions per the first unit time of a plurality of homes calculated by the control unit 106b to the EMS 103. The communication control unit 106a also receives a billing process command instructing to perform a billing system process from the billing server 104. The communication control unit 106a transmits to the billing server 104 the total power consumption per the second unit time of each home calculated by the power consumption total value calculating unit 101f in response to the billing process command.

The obtaining unit 106g obtains power consumptions per the first unit time of each home system 102 including various electrical equipment that are received from the SM 102a via the communication control unit 106a.

The power consumption storage unit 106i stores therein a plurality of power consumptions per the first unit time obtained by the obtaining unit 106g from the SM 102a.

The correcting unit 106c checks whether or not there is any error in the power consumptions $z_{(i,j)}$ stored in the power consumption storage unit 106i, calculates a correction amount for the power consumptions $z_{(i,j)}$ as necessary and corrects the power consumptions $z_{(i,j)}$ using the correction amount. The detailed method for correction is similar to that in the first embodiment.

After correction by the correcting unit 106c for a plurality of home systems 102, the control unit 106b adds up the power consumptions $z_{(i,j)}$ stored in the power consumption storage unit 106i per the first unit time and calculates total power consumption $a_{(j)} = \Sigma_i z_{(i,j)}$ of a plurality of homes per the first unit time.

The power consumption total value calculating unit 106f calculates the total value (total power consumption) of power consumed by the home system 102, which is a sum of the elements of the original data sequence per the second unit time, by a predetermined calculation method corresponding to the conversion rule (A,b) used for conversion by the data sequence conversion server 107 from the modified data sequence received from the modified data sequence management server 108.

Figure 17:
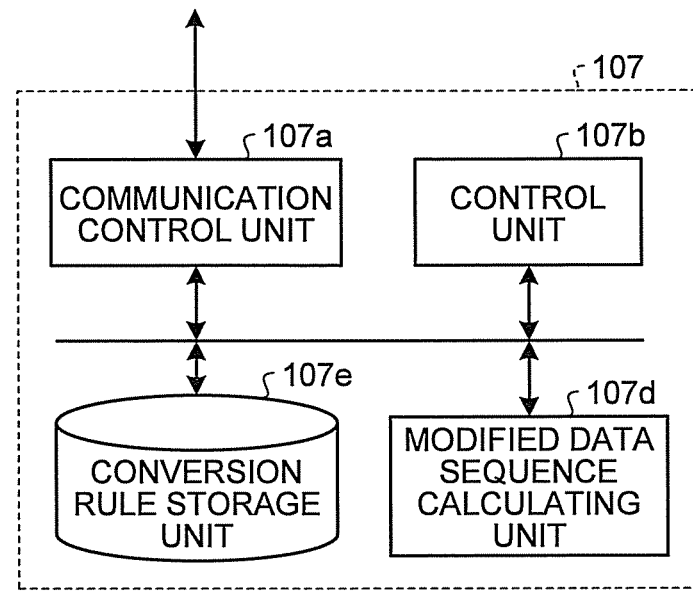
FIG. 17 is a diagram illustrating a functional configuration of a data sequence conversion server according to the second embodiment.

Next, various functions implemented by the data sequence conversion server 107 will be described. FIG. 17 is a diagram illustrating a functional configuration of the data sequence conversion server 107. As illustrated in FIG. 17, the data sequence conversion server 107 includes a communication control unit 107a, a control unit 107b, and a modified data sequence calculating unit 107d. These units are implemented by the communication I/F of the data sequence conversion server 107, and by executing various programs stored in the main storage unit and the auxiliary storage unit by the CPU of the data sequence conversion server 107.

The communication control unit 107a controls communication with other devices such as the data accumulation server 106. Cryptographic communication with TLS/SSL, SIP (session initiation protocol) or the like may be used for communication with other devices.

A conversion rule storage unit 107e stores therein the conversion rule (A,b) used by the modified data sequence calculating unit 107d.

The modified data sequence calculating unit 107d calculates a modified data sequence from a data sequence $z_{(i,j)}$ representing power consumptions per the first unit time of each home received by the communication control unit 107a by using a predetermined conversion rule (A,b). As described above, the modified data sequence calculating unit 107d may calculate the modified data sequence at a point where the entire data sequence $z_{(i,j)}$ of the power consumptions of the homes are obtained, or may calculate the modified data sequence after part of the data sequence $z_{(i,j)}$ of the power consumptions of the homes are obtained (or each time power consumption $z_{(i,j)}$ is received).

Figure 18:
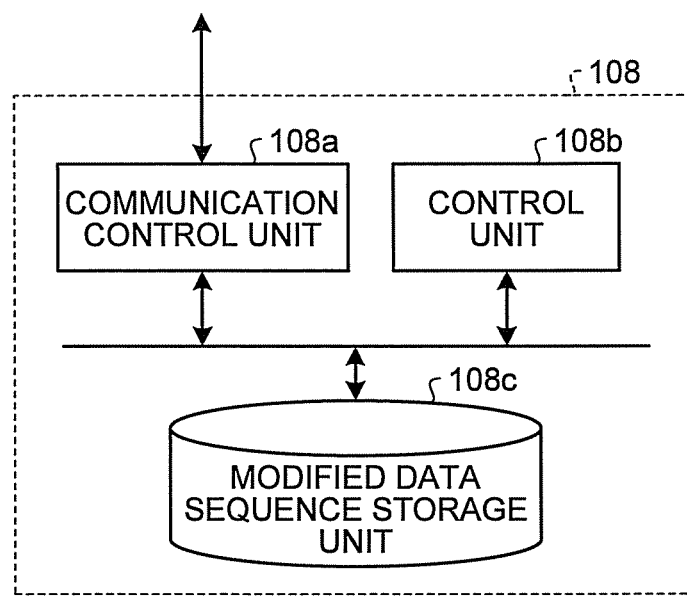
FIG. 18 is a diagram illustrating a functional configuration of a modified data sequence management server according to the second embodiment.

Next, various functions implemented by the modified data sequence management server 108 will be described. FIG. 18 is a diagram illustrating a functional configuration of the modified data sequence management server 108. As illustrated in FIG. 18, the modified data sequence management server 108 includes a communication control unit 108a, a control unit 108b and a modified data sequence storage unit 108c. These units are implemented by the communication I/F of the modified data sequence management server 108, by executing various programs stored in the main storage unit and the auxiliary storage unit by the CPU of the modified data sequence management server 108, and storage areas reserved in the storage unit and the like such as the HDD of the modified data sequence management server 108.

The control unit 108b controls the entire modified data sequence management server 108.

The communication control unit 108a controls communication with other devices such as the data accumulation server 106. Cryptographic communication with TLS/SSL, SIP (session initiation protocol) or the like may be used for communication with other devices.

When the communication control unit 108a receives a modified data sequence calculated by the data sequence conversion server 107, the modified data sequence storage unit 108c stores therein the modified data sequence in association with the home identification information.

Next, procedures of processes performed by the power consumption calculating system according to this embodiment will be described. First, procedures of a total power consumption calculating process will be described referring to FIG. 19. In the example illustrated in FIG. 19, the data sequence conversion server 107 generates a conversion rule (A,b) in advance and stores the generated conversion rule (A,b) in the conversion rule storage unit 107e. Different conversion rules (A,b) may be used for each home or for each second unit time. When different conversion rules (A,b) are used for each home or for each second unit time, the conversion rule storage unit 107e of the data sequence conversion server 107 stores the conversion rules (A,b) in association with the home identification information or information representing the second unit time. The conversion rule (A,b) is not limited to be generated by the data sequence conversion server 107. Alternatively, the conversion rule (A,b) may be received from another device and stored in the conversion rule storage unit 107e.

The processes to the point where the SM 102a has added up the power consumptions of the home system 102 per the first unit time and has stored the added up power consumptions in the power consumption storage unit 102a3 are performed in a manner similar to steps S1101 to S1104 of FIG. 11 of the first embodiment (steps S1901 to S1904).

The communication control unit 106a of the data accumulation server 106 accesses the SM 102a at least once per the first unit time and receives the power consumptions $z_{(i,j)}$ stored in the power consumption storage unit 102a3 (step S1905). In this process, the communication control unit 106a also receives the home identification information assigned to the home system 102 from the SM 102a.

The control unit 106b of the data accumulation server 106 stores the received power consumptions $z_{(i,j)}$ in the power consumption storage unit 106i (step S1906). In this process, the home identification information is also stored in association with the power consumptions $z_{(i,j)}$.

Then, the correcting unit 106c corrects the power consumptions $z_{(i,j)}$ of each home system 102 stored in the power consumption storage unit 106i (step S1907), and stores the corrected power consumptions $z_{(i,j)}$ again in the power consumption storage unit 106i.

Then, the communication control unit 106a of the data accumulation server 106 transmits the power consumptions $z_{(i,j)}$ stored in the power consumption storage unit 106i to the data sequence conversion server 107 (step S1908). Note that when different conversion rules are used for each home or for each second unit time, the data accumulation server 106 may transmit the home identification information or measurement times of $z_{(i,j)}$ together with the power consumptions $z_{(i,j)}$.

The control unit 106b of the data accumulation server 106 adds up power consumptions $z_{(i,j)}$ of a plurality of home systems 102, calculates a total power consumption "$a_{(j)}=\Sigma_i z_{(i,j)}$" of a plurality of homes per the first unit time, and transmits the total power consumption $a_{(j)}$ of the homes per the first unit time to the EMS 103 via the communication control unit 106a (step S1909). Note that steps S1906 to S1909 described above are a series of processes. Steps S1906 to S1909 may be performed in any order. Moreover, if steps S1906 to S1909 are performed and the power consumptions $z_{(i,j)}$ are not to be used in the subsequent error detection and correction, the data accumulation server 106 may erase the power consumptions $z_{(i,j)}$ from the power consumption storage unit 106i.

When the modified data sequence calculating unit 107d of the data sequence conversion server 107 receives the power consumptions $z_{(i,j)}$ from the data accumulation server 106, the modified data sequence calculating unit 107d calculates the modified data sequence based on the received data sequence $z_{(i,j)}$ and the conversion rule (A,b) stored in the conversion rule storage unit 107e (step S1910). The communication control unit 107a of the data sequence conversion server 107 then transmits the calculated modified data sequence and the home identification information to the modified data sequence management server 108 (step S1911). The communication control unit 107a may transmit the modified data sequence to the modified data sequence management server 108 via the data accumulation server 106 or may directly transmit the modified data sequence to the modified data sequence management server 108 when the data sequence conversion server 107 and the modified data sequence management server 108 are connected via a network or the like. Note that various methods can be used for the method for transmission by the communication control unit 107a similarly to the first embodiment.

When the communication control unit 108a of the modified data sequence management server 108 receives the modified data sequence, the communication control unit 108a stores the received modified data sequence in the modified data sequence storage unit 108c (step S1912). In this process, the modified data sequence is stored in association with the home identification information. The timing of storage is similar to that in the first embodiment, and the description thereof is not repeated.

The communicating unit 103a of the EMS 103 receives the total power consumption $a_{(j)}$ of a plurality of homes added up per the first unit time and stores the received total power consumption $a_{(j)}$ in the main storage unit, for example (step S1913). The total power consumption $a_{(j)}$ may be received from the data accumulation server 106 each time the first unit time (j) elapses or a plurality of total power consumptions corresponding to a plurality of first unit times may be received from the data accumulation server 106 after the first unit times has elapsed.

The EMS 103 then performs power control based on the total power consumption $a_{(j)}$ per the first unit time (j) (step S1914). After step S1914, the EMS 103 may erase the total power consumption $a_{(j)}$ from the main storage unit.

Figure 19:
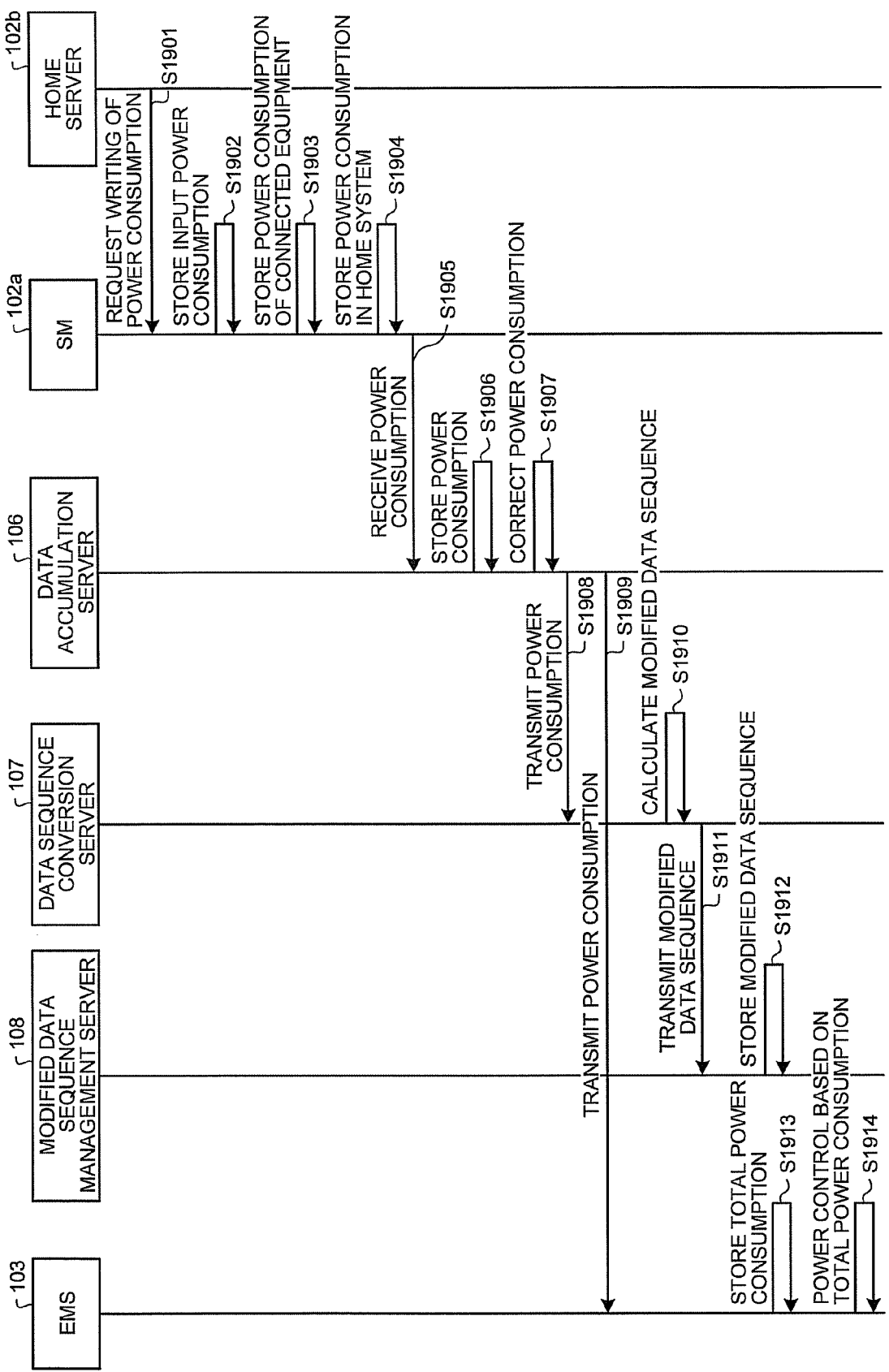
FIG. 19 is a sequence diagram illustrating procedures of a total power consumption calculating process according to the second embodiment.
Figure 20:
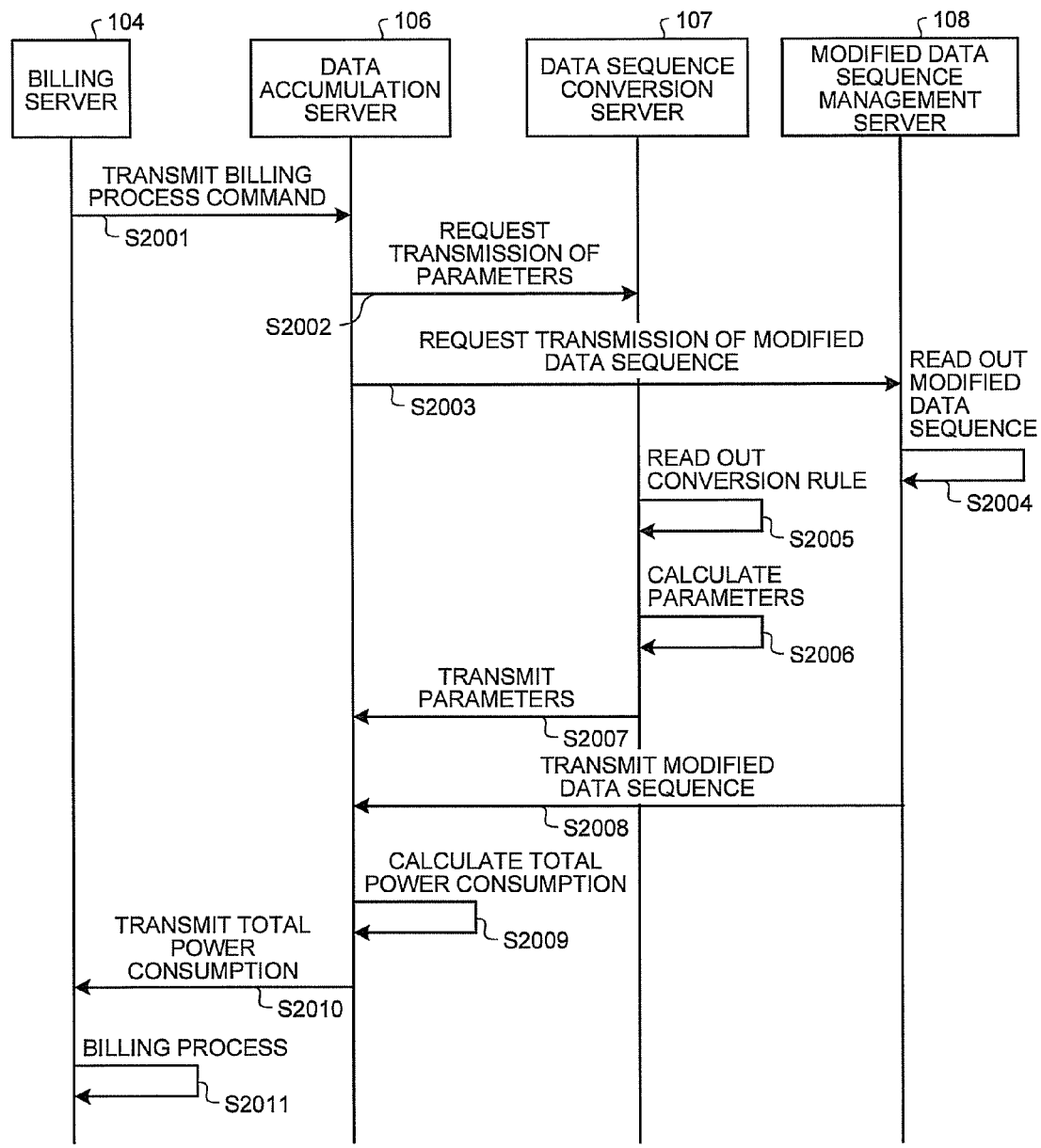
FIG. 20 is a sequence diagram illustrating procedures of a billing system process according to the second embodiment.

Next, procedures of the billing system process performed by the power consumption calculating system will be described. When the total power consumption calculating process illustrated in FIG. 19 is performed, the modified data sequence containing the power consumptions per the first unit time is stored in the modified data sequence storage unit 108c in association with the home identification information. Then, each time the second unit time elapses, the billing server 104 receives the total power consumption of each home in the second unit time from the MDMS 101 and performs the billing process. FIG. 20 is a sequence diagram illustrating procedures of the billing system process including the billing process in the power consumption calculating system.

First, the billing server 104 transmits a billing process command instructing to perform the billing system process to the data accumulation server 106 per the second unit time (step S2001). The billing process command specifies the second unit time and the home identification information for the billing process. The billing process command may be transmitted by the data accumulation server 106 to the billing server 104 instead of being transmitted by the billing server 104.

The communication control unit 106a of the data accumulation server 106 requests the data sequence conversion server 107 to transmit parameters to be used for the conversion method corresponding to the conversion rule (A,b) (step S2002). Next, the communication control unit 106a requests the modified data sequence management server 108 to transmit the modified data sequence for the second unit time (step S2003). Note that the home identification information is specified in the transmission request. The processes of steps S2002 and S2003 may be performed in any order.

Then, the control unit 108b of the modified data sequence management server 108 reads out the modified data sequence identified by the specified home identification information and the second unit time from the modified data sequence storage unit 108c (step S2004).

The control unit 107b of the data sequence conversion server 107, on the other hand, reads out the conversion rule (A,b) according to the request for transmitting parameters (step S2005). The control unit 107b then calculates the sum c[A] of the elements in each column of A and the sum c[b] of the elements of b, which are parameters to be used for calculation of the total power consumption, from the conversion rule (A,b) (step S2006). When different conversion rules are used for each home or for each second unit time, the data sequence conversion server 107 calculates c[A] and c[b] appropriate to the transmission request.

The communication control unit 107a of the data sequence conversion server 107 then transmits the calculated sums c[A] and c[b] (step S2007). Note that the data accumulation server 106 may receive the conversion rule (A,b) from the data sequence conversion server 107 and calculate c[A] and c[b] instead of receiving c[A] and c[b] from the data sequence conversion server 107.

Then, the communication control unit 108a of the modified data sequence management server 108 transmits the read modified data sequence $(z'_{(i,1)}, z'_{(i,2)}, \ldots, z'_{(i,m)})$ to the data accumulation server 106 (step S2008). Note that the processes of steps S2007 and S2008 may be performed in any order.

Then, the power consumption total value calculating unit 106f of the data accumulation server 106 calculates (restores) the total power consumption per the second unit time of each home by the following equation (10) using the received sums c[A] and c[b] (parameters) and the modified data sequence (step S2009).

$$\Sigma_j z_{(i,j)} = (\Sigma_{j'} z'_{(i,j')} - c[b])/c[A] \tag{10}$$

The index i corresponds to the home identification information. The index j corresponds to each element in the data sequence at the second unit time and is a value from 1 to n. The index j' corresponds to each element in the modified data sequence at the second unit time and is a value from 1 to m.

Then, the communication control unit 106a of the data accumulation server 106 transmits the calculated total power consumption $\Sigma_j z_{(i,j)}$ at the second unit time to the billing server 104 (step S2010). Note that the modified data sequence management server 108 may erase the modified data sequence $(z'_{(i,1)}, z'_{(i,2)}, \ldots, z'_{(i,m)})$ from the modified data sequence storage unit 108c predetermined time after transmission of the total power consumption $\Sigma_j z_{(i,j)}$ per the second unit time to the billing server 104. The predetermined time is a period during which there is a possibility that the total power consumption be transmitted again and received from the billing server 104. The predetermined time may be three months, for example.

The billing server 104 performs the billing process for each home based on the received total power consumption $\Sigma_j z_{(i,j)}$ in the second unit time (step S2011).

As described above, with the power consumption calculating system according to this embodiment, effects similar to those of the first embodiment can be obtained. In addition, since the servers for respective functions are provided, the processing load on each server is reduced. Moreover, since the conversion rule and the modified data sequence are distributed to and managed by different servers, the security can be improved.

Modified Example 1 of Second Embodiment

In the modified example 1 of the second embodiment, the MDMS is constituted by a plurality of devices similarly to the second embodiment, and the data sequence conversion server 107 uses a nonsingular matrix A as the conversion rule (A,b) similarly to the modified example 1 of the first embodiment. When the nonsingular matrix A is used, it is possible to calculate the original data sequence from the modified data sequence. It is therefore possible to transmit an original data sequence in response to a power consumption access request from a home.

Figure 21:
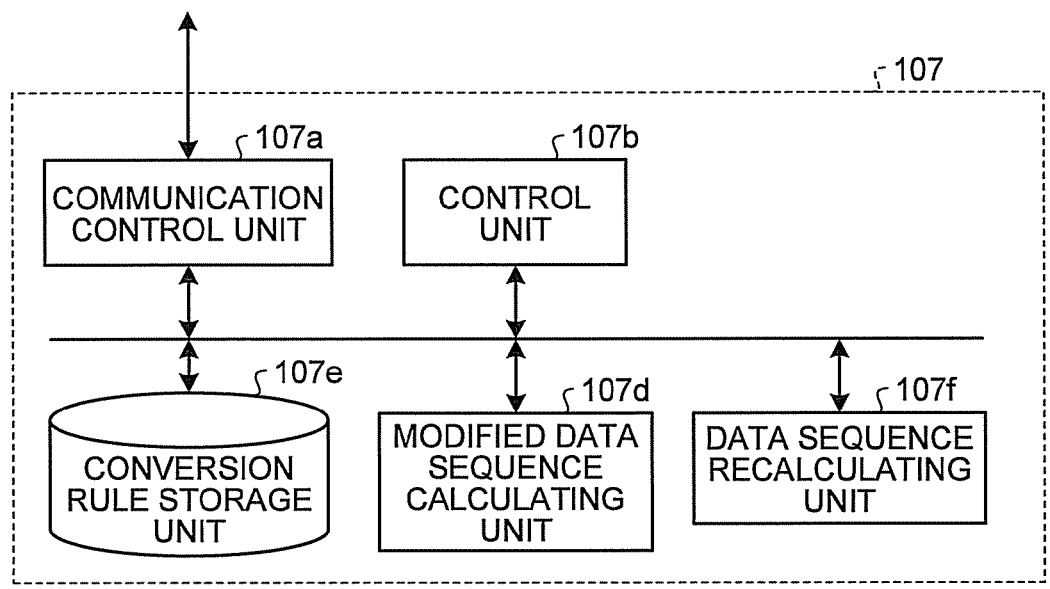
FIG. 21 is a diagram illustrating a functional configuration of a data sequence conversion server according to a modified example 1 of the second embodiment.

FIG. 21 is a diagram illustrating a functional configuration of a data sequence conversion server 107 according to the modified example 1 of the second embodiment. The data sequence conversion server 107 according to the modified example 1 of the second embodiment illustrated in FIG. 21 additionally includes a data sequence recalculating unit 107f as compared to the data sequence conversion server 107 of the second embodiment. Since the other systems and functional configurations of the power consumption calculating system according to this modified example are similar to those in the second embodiment, description thereof will not be repeated.

The data sequence recalculating unit 107f calculates the original data sequence by applying an inverse matrix of the nonsingular matrix A included in the conversion rule (A,b) stored in the conversion rule storage unit 107e to the modified data sequence. As described above, an inverse matrix of the nonsingular matrix A can be obtained in this modified example because the nonsingular matrix A is stored. The original data sequence can be calculated from the modified data sequence by using the inverse matrix.

Since procedures of the total power consumption calculating process and the billing process are similar to those described in the second embodiment, the description thereof will not be repeated. Different conversion rules (A,b) may be used for each home or for each second unit time in the total power consumption calculating process. When different conversion rules (A,b) are used for each home or for each second unit time, the data sequence conversion server 107 stores the conversion rules (A,b) in association with the home identification information and information representing the second unit time in the conversion rule storage unit 107e. Next, procedures of the access requesting process performed by the power consumption calculating system according to this modified example will be described.

Figure 22:
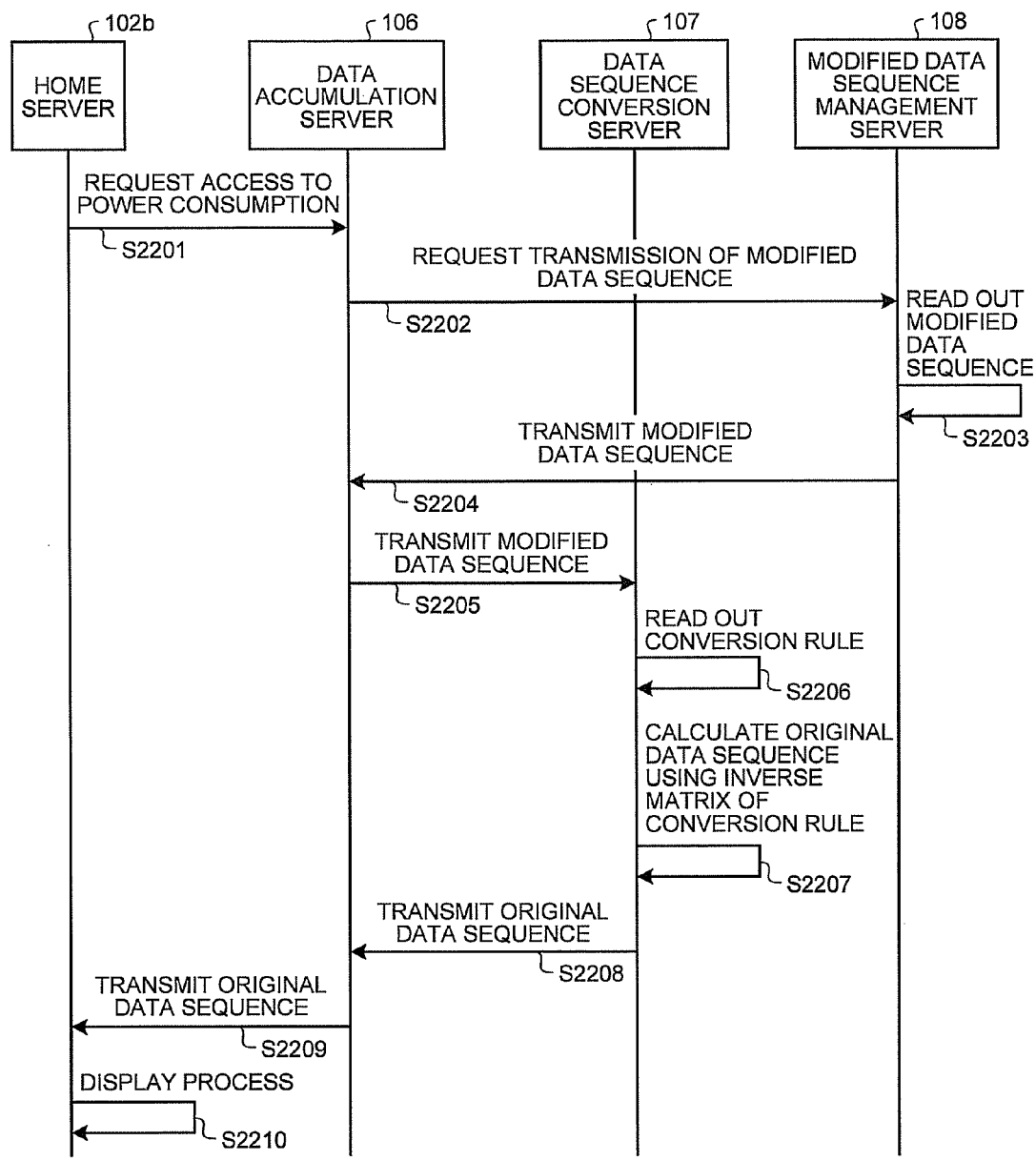
FIG. 22 is a sequence diagram illustrating procedures of an access requesting process according to the modified example 1 of the second embodiment.

It is assumed that the total power consumption calculating process is performed before the access requesting process, and that the modified data sequence $(z'_{(i,1)}, z'_{(i,2)}, \ldots, z'_{(i,m)})$ of power consumptions per the first unit time of each home is stored in association with the home identification information in the modified data sequence storage unit 101g. The conversion rule storage unit 107e stores therein the conversion rule (A,b) including the nonsingular matrix A in advance. FIG. 22 is a sequence diagram illustrating procedures of the access requesting process in the power consumption calculating system.

The home server 102b of the home system 102 transmits an access request command Req_i requesting access to power consumptions to the data accumulating server 106 (step S2201).

When the communication control unit 106a of the data accumulation server 106 receives the access request command Req_i, the communication control unit 106a transmits a request for transmitting a modified data sequence associated with the home identification information and the access request period specified by the access request command Req_i to the modified data sequence management server 108 (step S2202).

Upon receiving the request for transmitting the modified data sequence, the communication control unit 108a of the modified data sequence management server 108 reads out the modified data sequence $(z'_{(i,1)}, z'_{(i,2)}, \ldots, z'_{(i,n)})$ stored in association with the home identification information and the access request period included in the transmission request (step S2203).

The communication control unit 108a of the modified data sequence management server 108 transmits the modified data sequence $(z'_{(i,1)}, z'_{(i,2)}, \ldots, z'_{(i,n)})$ associated with the home identification information and the access request period specified by the access request to the data accumulation server 106 (step S2204). When the access request period is over a plurality of second unit times, the communication control unit 108a transmits a plurality of modified data sequences associated thereto, respectively.

The communication control unit 106a of the data accumulation server 106 transmits the received modified data sequence $(z'_{(i,1)}, z'_{(i,2)}, \ldots, z'_{(i,n)})$, the home identification information and the access request period to the data sequence conversion server 107 (step S2205).

The data sequence recalculating unit 107f of the data sequence conversion server 107 reads out the conversion rule (A,b) from the conversion rule storage unit 107e (step S2206).

The data sequence recalculating unit 107f of the data sequence conversion server 107 calculates the original data sequence $(z_{(i,1)}, z_{(i,2)}, \ldots, z_{(i,n)})$ representing power consumptions in time series from the modified data sequence by using an inverse matrix of a nonsingular matrix A included in the conversion rule (A,b) (step S2207). The same equation as the equation (9) is used by the data sequence recalculating unit 107f.

The communication control unit 107a of the data sequence conversion server 107 then transmits the calculated original data sequence to the data accumulation server 106 (step S2208).

Then, the communication control unit 106a of the data accumulation server 106 transmits $z_{(i,k)}, z_{(i,k+1)}, \ldots, z_{(i,l)}$ associated with the access request period out of the received original data sequence to the home server 102b (step S2209). It is assumed here that $1 \leq k < l \leq n$ is satisfied.

The home server 102b displays $z_{(i,k)}, z_{(i,k+1)}, \ldots, z_{(i,l)}$ received from the data accumulation server 106 on the display unit (step S2210). The access requesting process is terminated here.

With the power consumption calculating system according to the modified example 1 of the second embodiment, the effects exhibited in the modified example 1 of the first embodiment can be obtained in addition to the effects obtained in the second embodiment.

Modified Example 2 of Second Embodiment

In the second embodiment and the modified example 1 of the second embodiment, examples in which the data accumulation server 106, the data sequence conversion server 107 and the modified data sequence management server 108 serve as the MDMS 101 in the first embodiment have been described. Although examples in which the data accumulation server 106, the data sequence conversion server 107 and the modified data sequence management server 108 are provided as separate servers have been described in the second embodiment and the modified example 1 of the second embodiment, the servers are not limited to such configuration. For example, the functions of the data accumulation server 106 may be installed on the data sequence conversion server 107 or the modified data sequence management server 108.

For example, when the data sequence conversion server 107 has the functions of the data accumulation server 106, the data accumulation server 106 in the second embodiment and the modified example thereof described above is read as the data sequence conversion server 107. Alternatively, when the modified data sequence management server 108 has the functions of the data accumulation server 106, the data accumulation server 106 in the second embodiment and the modified example thereof described above is read as the modified data sequence management server 108. Alternatively, the SM 102a or the home server 102b may have the functions of the data sequence conversion server 107. In this case, the data sequence conversion server 107 is read as the SM 102a or the home server 102b.

Modified Examples

The power consumption calculating system is not limited to the embodiments and the modified examples described above, and may have various forms.

For example, the billing server 104 performs the billing process based on the total power consumption in the second unit time for each home in the embodiments described above. In a smart grid, however, the billing unit may be increased (the unit price of power may be increased) during a period of time when the power consumption is high. The following two modified examples can be considered when such dynamic pricing is performed.

In a first modified example, the MDMS 101 or the data accumulation server 106 prepares different conversion matrices for first unit times with different power, unit prices, and calculates a modified data sequence for each power unit price representing the power consumption per each first unit time in time series. As a result, the total power consumption per the second unit time can be calculated for each unit price. k unit prices of power included in the second unit time are expressed as p(i,1), p(i,2), . . . , p(i,k). k is the number of different unit prices of power.

For example, when the unit price of power is JPY 10 through the second unit time, k=1 and p(j,1)=10 are satisfied. Alternatively, when the unit price of the power at peak hour during the day is JPY 15, the unit price of the power at a late hour is JPY 5 and the unit price at the other hours is JPY 10, k=3, p(j,1)=5 (late hour), p(j,2)=10 (normal hour) and p(j,3)=15 (peak hour) are satisfied. Note that different unit prices of power for different days may be used instead of different unit prices of per for different hours of a day.

The MDMS 101 sets the unit price p(i,j) per the first unit time in advance. The unit price of power may be determined by the MDMS 101 itself, or the MDMS 101 may receive and set a unit price determined by the EMS 103 or another server.

Procedures of a total power consumption calculating process including a process of calculating a modified data sequence from a data sequence of power consumptions per the first unit time when different unit prices of power are set for each first unit time by the power consumption calculating system according to this modified example will be described. The procedures are similar to those in FIG. 11, and the description thereof is made referring to FIG. 11.

The description of steps S1101 to S1107 in the total power consumption calculating process according to this modified example is similar to that made referring to FIG. 11 of the first embodiment, and is thus not repeated.

The modified data sequence calculating unit 101d of the MDMS 101 according to this modified example calculates a plurality of modified data sequences for each unit price of power (step S1108). For example, when the power consumption in a first unit time corresponding to an unit price (i,l) of power is $(z_{(i,x\_1)}, z_{(i,x\_2)}, \ldots, z_{(i,x\_l)})$ out of the data sequence $(z_{(i,1)}, z_{(i,2)}, \ldots, z_{(i,n)})$, the modified data sequence is calculated from a data sequence $(0, \ldots, 0, z_{(i,x\_1)}, 0, \ldots, 0, z_{(i,x\_2)}, 0, \ldots, 0, z_{(i,x\_l)}, 0, \ldots, 0)$ of m elements in which data other than $(z_{(i,x\_1)}, z_{(i,x\_2)}, \ldots, z_{(i,x\_l)})$ are "0". The calculation of the modified data sequence is performed for each unit price of power.

The description of steps S1109 to S1112 in the total power consumption calculating process according to this modified example is similar to that made referring to FIG. 11 of the first embodiment, and is thus not repeated.

Procedures of a billing process based on the modified data sequence calculated for each unit price of power when different unit prices of power are set for each first unit time by the power consumption calculating system according to this modified example will be described. The procedures are similar to those in FIG. 12, and the description thereof is made referring to FIG. 12.

The MDMS 101 according to this modified example performs the processes of steps S1201 to S1205 to the point where the MDMS 101 has calculated partial total power consumptions per the second unit time of each home from the respective modified data sequences calculated for each unit price of power, and transmitted the partial total power consumption of each home. Next in step S1206, the billing server 104 calculates the total power consumption per the second unit time of each home by multiplying the partial total power consumption per the second unit time of each home calculated for each unit price of power by the unit price of power and obtaining a sum thereof.

Procedures of an access requesting process using the modified data sequence calculated for each unit price of power when different unit prices of power are set for each first unit time by the power consumption calculating system according to this modified example will be described. The procedures are similar to those in FIG. 14, and the description thereof is made referring to FIG. 14.

The description of step S1401 in the access requesting process according to this modified example is similar to that made referring to FIG. 14 of the modified example 1 of the first embodiment, and is thus not repeated.

The data sequence recalculating unit 101h of the MDMS 101 reads out the modified data sequences calculated for the respective unit prices of power (step S1402). The data sequence recalculating unit 101h of the MDMS 101 then reads out different conversion rules for different unit prices of power (step S1403).

Next, the data sequence recalculating unit 101h of the MDMS 101 calculates the original data sequence $(0, \ldots, 0, z_{(i,x\_1)}, 0, \ldots, 0, z_{(i,x\_2)}, 0, \ldots, 0, z_{(i,x\_l)}, 0, \ldots, 0)$ associated with the modified data sequence calculated for the unit prices of power, respectively, by using inverse matrices of different conversion rules for different unit prices of power (step S1404). The data sequence recalculating unit 101h of the MDMS 101 extracts $(z_{(i,x\_1)}, z_{(i,x\_2)}, \ldots, z_{(i,x\_l)})$ associated with the unit prices per the first unit time and arranges the extracted $(z_{(i,x\_1)}, z_{(i,x\_2)}, \ldots, z_{(i,x\_l)})$ in time series to restore the data sequence $(z_{(i,1)}, z_{(i,2)}, \ldots, z_{(i,n)})$.

The description of step S1405 and subsequent steps in the access requesting process according to this modified example is similar to that made referring to FIG. 14 of the modified example 1 of the first embodiment, and is thus not repeated.

In a second modified example, the MDMS 101 or the data accumulation server 106 calculates a modified data sequence from the data sequence of power consumptions multiplied by the unit prices of power in advance by using conversion matrices. Since the modified data sequence already includes the unit price of power, the electricity charges per the second unit time can be calculated.

Procedures of a total power consumption calculating process according to a modified example in which the MDMS 101 calculates a modified data sequence from a data sequence including power consumptions multiplied by the unit prices of power in advance will be described. Since the procedures themselves are similar to those illustrated in FIG. 7, the illustration is not repeated.

Procedures of a total power consumption calculating process including a process of calculating a modified data sequence from a data sequence of elements obtained by multiplying the power consumptions per the first unit time by the unit price of power performed by the power consumption calculating system according to this modified example will be described. The procedures are similar to those in FIG. 11, and the description thereof is made referring to FIG. 11.

Since the description of steps S1101 to S1107 is similar to that made referring to FIG. 11 of the first embodiment, the description will not be repeated. In step S1108, the modified data sequence calculating unit 101d of the MDMS 101 calculates a modified data sequence from a data sequence in which the power consumptions are multiplied by the respective unit prices of power. For example, when the unit prices of power of the data sequences $(z_{(i,1)}, z_{(i,2)}, \ldots, z_{(i,n)})$ for the respective unit times are $(p_{(i,l\_1)}, p_{(i,l\_2)}, \ldots, p_{(i,l\_n)})$, the modified data sequences are calculated from the data sequences $(z_{(i,1)}p_{(i,l\_1)}, z_{(i,2)}p_{(i,l\_2)}, \ldots, z_{(i,n)}p_{(i,l\_n)})$ having elements obtained by multiplying the power consumptions by the respective unit prices of power. Since the description of steps S1109 to S1112 is similar to that of FIG. 11, the description will not be repeated.

Procedures of a billing process based on the modified data sequences calculated from the data sequence of elements obtained by multiplying the power consumptions per the first unit time by the respective unit prices performed by the power consumption calculating system according to this modified example will be described. The procedures are similar to those in FIG. 12, and the description thereof is made referring to FIG. 12.

Since the description of steps S1201 to S1203 is similar to that made referring to FIG. 12 of the first embodiment, the description will not be repeated. However, the read modified data sequence results from conversion of the data sequence having the elements obtained by multiplying the power consumptions by the respective unit prices.

Then, in step S1204, the power consumption total value calculating unit 106f performs calculation by applying the read parameters for the conversion method to the read modified data sequences to calculate the electricity charges unlike FIG. 12. In other words, this modified example is different from the procedures of FIG. 12 in that the electricity charges are calculated in this modified example while the total power consumption is calculated in step S1204 of the first embodiment. The processes in the subsequent steps S1205 and S1206 are similar to those described referring to FIG. 12 of the first embodiment up to the billing process.

Procedures of an access requesting process based on the modified data sequences calculated from the data sequences of elements obtained by multiplying the power consumptions per the first unit time by the respective unit prices performed by the power consumption calculating system according to this modified example will be described. The procedures are similar to those in FIG. 14, and the description thereof is made referring to FIG. 14.

Since the description of steps S1401 to S1403 is similar to that made referring to FIG. 14 of the modified example 1 of the first embodiment, the description will not be repeated.

Then, in step S1404, the data sequence recalculating unit 101h of the MDMS 101 calculates the data sequence ($z_{(i,1)}$, $z_{(i,2)}$, ..., $z_{(i,n)}$) from the modified data sequence by using an inverse matrix of the matrix A or the like included in the conversion rule (A,b). The data sequence recalculating unit 101h then divides the data sequence ($z_{(i,1)}$, $z_{(i,2)}$, ..., $z_{(i,n)}$) by the unit prices ($p_{(i,l\_1)}$, $p_{(i,l\_2)}$, ..., $p_{(i,l\_n)}$), associated with the respective first unit times to restore the data sequence ($z_{(i,1)}$, $z_{(i,2)}$, ..., $z_{(i,n)}$). The description of step S1405 and subsequent steps is similar to that made referring to FIG. 14 of the modified example 1 of the first embodiment, and is thus not repeated.

Note that the data accumulation server 106 can have similar configuration in either of the modified example in which the modified data sequences are calculated from the data sequences of the respective first unit times with different unit prices and the modified example in which the modified data sequences are calculated from the data sequences of the power consumptions multiplied by the respective unit prices in advance.

Moreover, modified examples supporting dynamic pricing are not limited the two modified examples described above but various modified examples can be considered.

In the embodiments and modified examples described above, it is per the first unit time that the SM 102a adds up the power consumptions. The addition by the SM 102a is not limited to such a regular addition by may be performed at any timings.

In the power consumption calculating system according to the first embodiment and modified examples described above, communications between the MDMS 101 and the billing server 104, between the MDMS 101 and the EMS 103, between the SM 102a and the MDMS 101, and between the MDMS 101 and the home server 102b are described. Furthermore, in the power consumption calculating system according to the second embodiment and modified examples described above, communications between the data accumulation server 106 and the data sequence conversion server 107, between the data accumulation server 106 and the modified data sequence management server 108, between the data accumulation server 106 and the billing server 104, and between the data accumulation server 106 and the EMS 103 are described. Cryptographic communications such as OpenSSL may be used for these communications so as to keep transmitted/received information secret. Furthermore, device authentication for authenticating each other may be performed in communication.

For example, in communications between the SM 102a and the MDMS 101 and between the SM 102a and the data accumulation server 106, the SM 102a stores an encrypted data of the power consumption added up per the first unit time or an authenticator for keeping the communications secret or for authenticating the communications. On the other hand, the MDMS 101 or the data accumulation server 106 decodes the encrypted data read out from the SM 102a to restore the power consumption $z_{(i,j)}$.

In the embodiments described above, the SM 102a may function as storage means to/from which information is written or read by at least one of the electrical equipment 102d, the home server 102b, the MDMS 101 and the data accumulation server 106, and have a function of autonomously transmitting information according to a program specified in advance or an instruction from another device. Furthermore, when the communication between the SM 102a and the MDMS 101 or the data accumulation server 106 is to be kept secret or to be authenticated, the SM 102a stores the power consumption added up per the first unit time in the power consumption storage unit 102a3, reads out the power consumption from the power consumption storage unit 102a3 for transmitting the power consumption to the MDMS 101 or the data accumulation server 106. The power consumption may be transmitted after being encrypted or adding an authenticator thereto.

In the embodiments described above, the home server 102b communicates directly with the MDMS 101 or the data accumulation server 106 without a network or the like. However, the SM 102a may communicate with the MDMS 101 or the data accumulation server 106 via the network or the like.

In the embodiments described above, the EMS 103 and the billing server 104 are employed as the application server. Alternatively, a power transaction service server that manages power distribution may be employed. For example, when a unit price of power depends on total power consumption of a plurality of homes in the first unit time, the power transaction service server may receive the total power consumption of the homes in the first unit time (the total power consumption may be encrypted) from the MDMS 101, determine the unit price of power based on the total power consumption and conduct power transactions.

In addition, a power-saving application server may be employed as the application server. The power-saving application server performs power control on each home in cooperation with the home server 102b according to the total power consumption of a plurality of homes in the first unit time and the determined unit price of power. The power-saving application server may receive total power consumption of a plurality of homes in the first unit time (the total power consumption may be encrypted) from the MDMS 101 and perform power control on each home based on the total power consumption of the homes in the first unit time instead of performing power control on each home using the total power consumption of a plurality of homes in the first unit time. Moreover, the power-saving application server may receive power consumption of each home per the second unit time (or part of the second unit time) (the power consumption may be encrypted) from the MDMS 101 and performs power control on each home using the power consumption of each home per the second unit time (or part of the second unit time), similarly to the billing server 104.

The configurations according to the embodiments described above can also be applied to calculation of gas consumption, water consumption and the like in addition to calculation of power consumption.

The power consumption calculating system is not limited to the embodiments presented above, but may be embodied with various modified components in implementation thereof without departing from the scope thereof. Further, the invention can be embodied in various forms by appropriately combining a plurality of components disclosed in the embodiment. For example, some of the components presented in the embodiment may be omitted. In addition, various modifications as described as examples below may be made.

In the embodiments described above, various programs executed in at least one of the MDMS 101, the SM 102*a*, the home server 102*b*, the EMS 103, the billing server 104, the data accumulation server 106, the data sequence conversion server 107 and the modified data sequence management server 108 may be stored on a computer system connected to a network such as the Internet, and provided by being downloaded via the network. The various programs may also be recorded on a computer readable recording medium such as a CD-ROM, a flexible disk (FD), a CD-R and a digital versatile disk (DVD) in a form of a file that can be installed or executed, and provided as a computer program product.

In this manner, with the devices of the power consumption calculating system according to the first and second embodiments and the modified examples described above, the changes in the power consumption per unit time of each home or office are managed in the form of the modified data sequences from which the power consumption per unit time cannot be known, and total power consumption can be obtained as necessary without calculating the original data sequences. Therefore, privacy information of each home or office can be protected.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data converting device connected to a power meter configured to add up power consumptions of electrical equipment, the device comprising:
 a receiver that receives power consumptions per predetermined unit time added up by the power meter; and,
 a calculator that calculates a second sequence to be stored as added up power consumptions in a storage from a first sequence containing the power consumptions per unit time received by the receiver in time series by using a conversion rule for converting a value of a second element in the second sequence based on a value of a first element in the first sequence, and enables to restore an element of the converted second sequence to an element of the first sequence; and
 a total value calculator that calculates a total value of elements of the first sequence from a sum of elements of the second sequence by a calculation method based on the conversion rule without restoring each element of the first sequence.

2. The device according to claim 1, wherein the conversion rule used by the calculator is a non-singular matrix, in which the number of rows and columns are same as the number of elements of the first sequence and total values of elements of the respective rows are equal, and
 the device further comprises a sequence calculator configured to calculate the first sequence by applying an inverse matrix of the non-singular matrix to the second sequence.

3. The device according to claim 2, wherein
 the calculation method used by the total value calculator calculates the sum of elements of the second sequence and then divides the sum by the total values of elements of respective rows of the nonsingular matrix.

4. The device according to claim 1, wherein the conversion rule used by the calculator is a rule for rearranging the elements of the first sequence according to a predetermined rule to calculate the second sequence.

5. The device according to claim 1, further comprising a storage configured to store therein the second sequence calculated by the calculator.

6. The device according to claim 1, further comprising a storage configured to store therein the conversion rule in a manner that the conversion rule cannot be externally referred to.

7. A data converting device connected to a power meter configured to add up power consumptions of electrical equipment, comprising:
 a receiver that receives the power consumptions per the predetermined unit time added up by the power meter; and,
 a calculator that calculates a second sequence to be stored as added up power consumptions in a storage from a first sequence containing the power consumption per unit time received by the receiver in time series by using a conversion rule for converting a value of a second element in the second sequence based on a value of a first element in the first sequence, wherein
 a total value of elements of the first sequence is calculated based on the second sequence, and
 the conversion rule used by the calculator is a non-singular matrix, in which the numbers of rows and columns are same as the number of elements of the first sequence and total values of elements of the respective rows are equal.

8. A non-transitory computer-readable recording medium that stores therein a computer program for causing a computer to execute a method employed in a data converting device connected to a power meter configured to add up power consumptions of electrical equipment, the method comprising:
 receiving power consumptions per predetermined unit time added up by the power meter; and
 calculating a second sequence to be stored as added up power consumptions in a storage from a first sequence containing the power consumptions per unit time received in time series by using a conversion rule for converting a value of a second element in the second sequence based on a value of a first element in the first sequence, and enables to restore an element of the converted second sequence to an element of the first sequence, and
 calculating a total value of elements of the first sequence from a sum of each element of the second sequence by a calculation method based on the conversion rule without restoring each element of the first sequence.

9. A non-transitory computer-readable recording medium that stores therein a computer program for causing a computer to execute a method employed in a data converting device connected to a power meter configured to add up power consumptions of electrical equipment, to execute a data converting method, the method comprising:
 receiving the power consumptions per the predetermined unit time added up by the power meter; and
 calculating a second sequence to be stored as added up power consumptions in a storage from a first sequence containing the power consumption per unit time received in time series by using a conversion rule for converting a value of a second element in the second sequence based on a value of a first element in the first sequence, wherein a total value of elements of the first sequence is calculated based on the second sequence, and the conversion rule used at the calculating is a non-singular matrix, in which the numbers of rows and columns are same as the number of elements of the first sequence and total values of elements of the respective rows are equal.

10. A data converting method employed in a data converting device connected to a power meter configured to add up power consumptions of electrical equipment, the method comprising:

receiving power consumptions per predetermined unit time added up by the power meter; and calculating a second sequence to be stored as added up power consumptions in a storage from a first sequence containing the power consumptions per unit time received in time series by using a conversion rule for converting a value of a second element in the second sequence based on a value of a first element in the first sequence, and enables to restore an element of the converted second sequence to an element of the first sequence, and calculating a total value of elements of the first sequence from a sum of each element of the second sequence by a calculation method based on the conversion rule without restoring each element of the first sequence.

11. A data converting method employed in a data converting device connected to a power meter configured to add up power consumptions of electrical equipment, the method comprising:

receiving the power consumptions per the predetermined unit time added up by the power meter; and calculating a second sequence to be stored as added up power consumptions in a storage from a first sequence containing the power consumption per unit time received in time series by using a conversion rule for converting a value of a second element in the second sequence based on a value of a first element in the first sequence, wherein a total value of elements of the first sequence is calculated based on the second sequence, and the conversion rule used at the calculating is a non-singular matrix, in which the numbers of rows and columns are same as the number of elements of the first sequence and total values of elements of the respective rows are equal.

* * * * *